(12) United States Patent
Then et al.

(10) Patent No.: US 10,763,350 B2
(45) Date of Patent: Sep. 1, 2020

(54) TRANSISTOR CONNECTED DIODES AND CONNECTED III-N DEVICES AND THEIR METHODS OF FABRICATION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/321,789

(22) PCT Filed: Sep. 30, 2016

(86) PCT No.: PCT/US2016/054964
§ 371 (c)(1),
(2) Date: Jan. 29, 2019

(87) PCT Pub. No.: WO2018/063386
PCT Pub. Date: Apr. 5, 2018

(65) Prior Publication Data
US 2020/0066890 A1   Feb. 27, 2020

(51) Int. Cl.
*H01L 29/15*   (2006.01)
*H01L 29/778*   (2006.01)
(Continued)

(52) U.S. Cl.
CPC ...... *H01L 29/7786* (2013.01); *H01L 27/0605* (2013.01); *H01L 27/0629* (2013.01);
(Continued)

(58) Field of Classification Search
CPC ............ H01L 29/7786; H01L 29/0847; H01L 27/0629; H01L 27/0605
See application file for complete search history.

(56) References Cited

U.S. PATENT DOCUMENTS 7,279,697 B2   10/2007  Beach
2008/0296618 A1   12/2008  Shu et al.
(Continued)

OTHER PUBLICATIONS

International Preliminary Report on Patentability for International Patent Application No. PCT/US2016/054964 dated Apr. 11, 2019, 7 pgs.
(Continued)

*Primary Examiner* — Phuc T Dang
(74) *Attorney, Agent, or Firm* — Schwabe, Williamson & Wyatt, P.C.

(57) ABSTRACT

Transistor connected diode structures are described. In an example, the transistor connected diode structure includes a group III-N semiconductor material disposed on substrate. A raised source structure and a raised drain structure are disposed on the group III-N semiconductor material. A mobility enhancement layer is disposed on the group III-N semiconductor material. A polarization charge inducing layer is disposed on the mobility enhancement layer, the polarization charge inducing layer having a first portion and a second portion separated by a gap. A gate dielectric layer disposed on the mobility enhancement layer in the gap. A first metal electrode having a first portion disposed on the raised drain structure, a second portion disposed above the second portion of the polarization charge inducing layer and a third portion disposed on the gate dielectric layer in the gap. A second metal electrode disposed on the raised source structure.

24 Claims, 21 Drawing Sheets

(51) Int. Cl.
  *H01L 27/06* (2006.01)
  *H01L 29/08* (2006.01)
  *H01L 29/20* (2006.01)
  *H01L 29/205* (2006.01)
  *H01L 29/45* (2006.01)
  *H01L 29/66* (2006.01)
  *H01L 29/861* (2006.01)

(52) U.S. Cl.
  CPC ...... *H01L 29/0847* (2013.01); *H01L 29/2003* (2013.01); *H01L 29/205* (2013.01); *H01L 29/452* (2013.01); *H01L 29/66219* (2013.01); *H01L 29/66462* (2013.01); *H01L 29/861* (2013.01)

(56) References Cited

U.S. PATENT DOCUMENTS

2012/0261718 A1* 10/2012 Sosa Cortes ...... H01L 29/41783
                                                        257/192
2013/0141156 A1  6/2013 Teo et al.
2013/0146953 A1  6/2013 Cheng et al.
2015/0187924 A1* 7/2015 Dasgupta .......... H01L 21/30617
                                                        257/76
2015/0200291 A1* 7/2015 Alptekin ............. H01L 29/785
                                                        257/401
2015/0235908 A1  8/2015 Cheng et al.
2015/0303313 A1* 10/2015 Mallela ................ H01L 29/516
                                                        327/543

OTHER PUBLICATIONS

International Search Report and Written Opinion for International Patent Application No. PCT/US2016/054964 dated Jun. 29, 2017, 10 pgs.

* cited by examiner

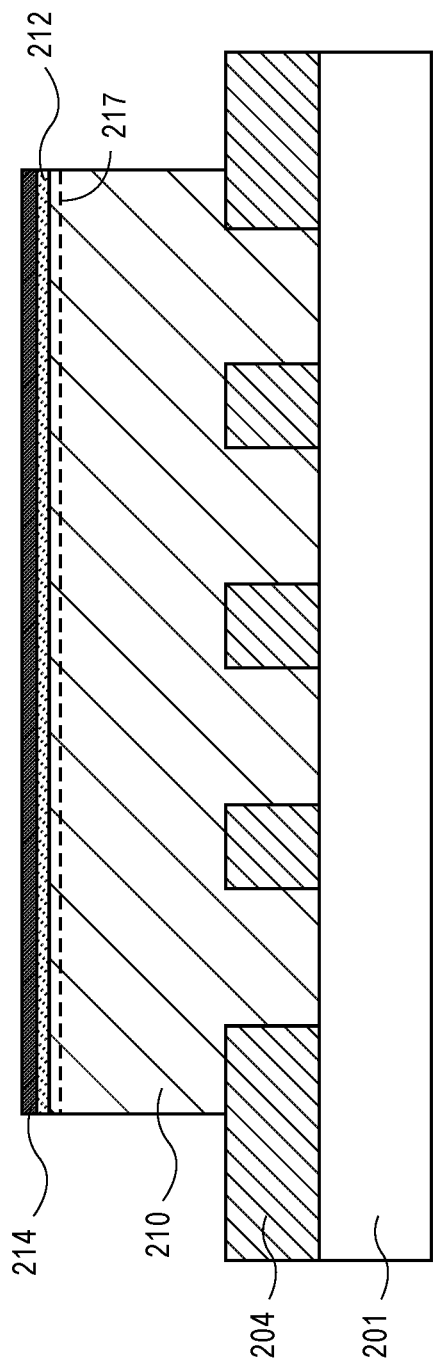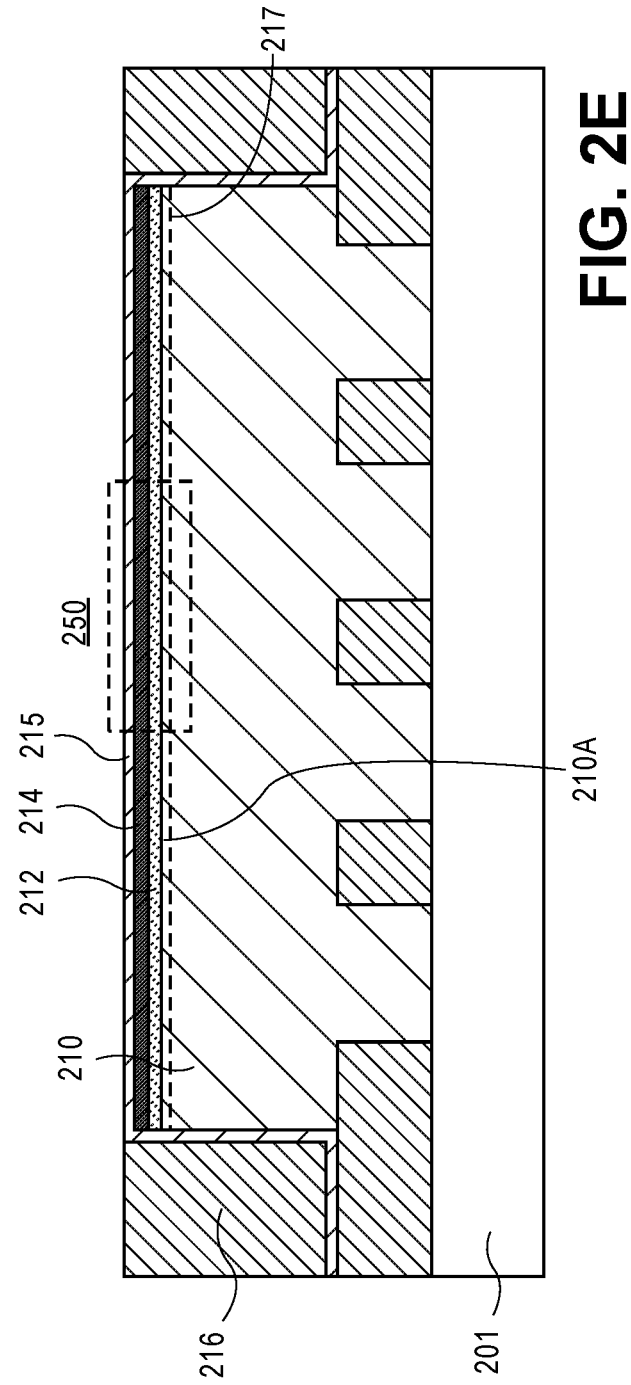

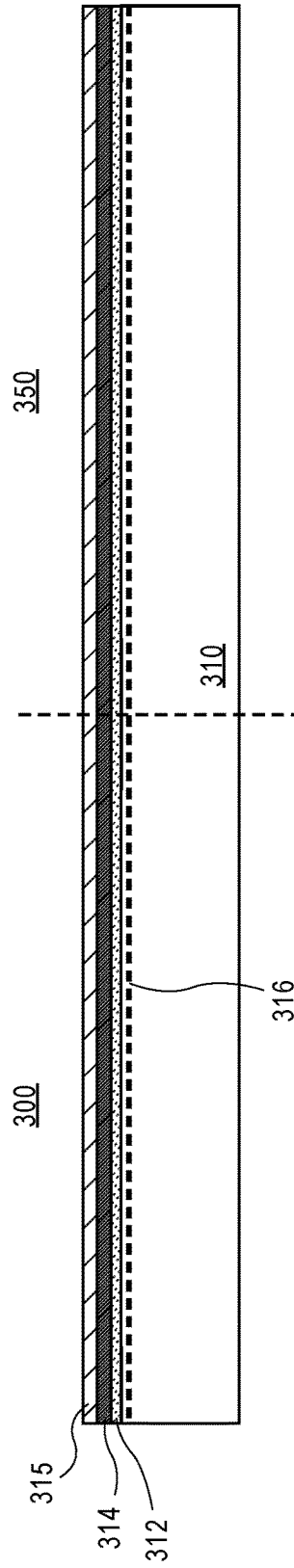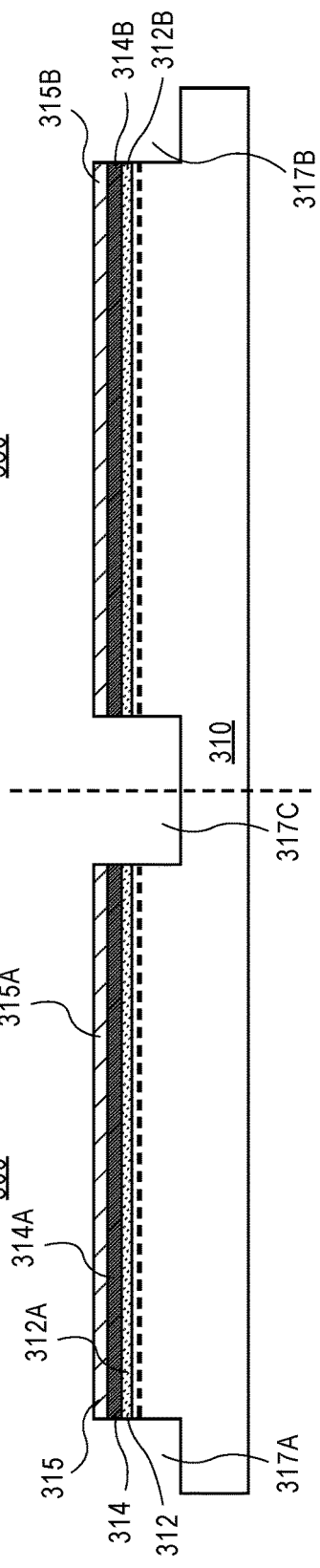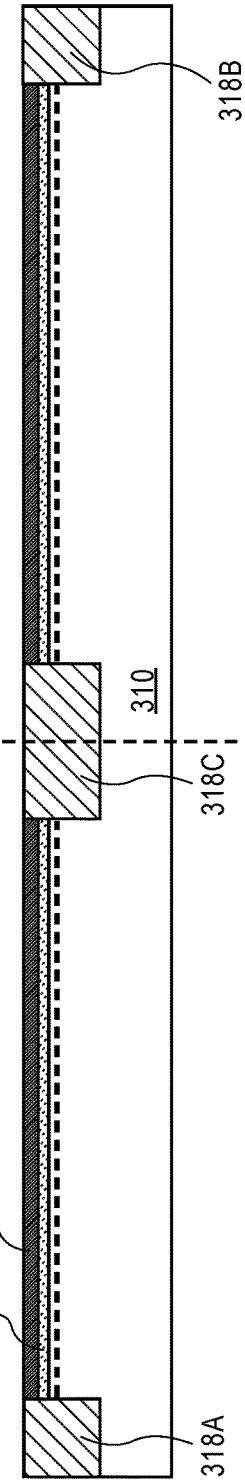

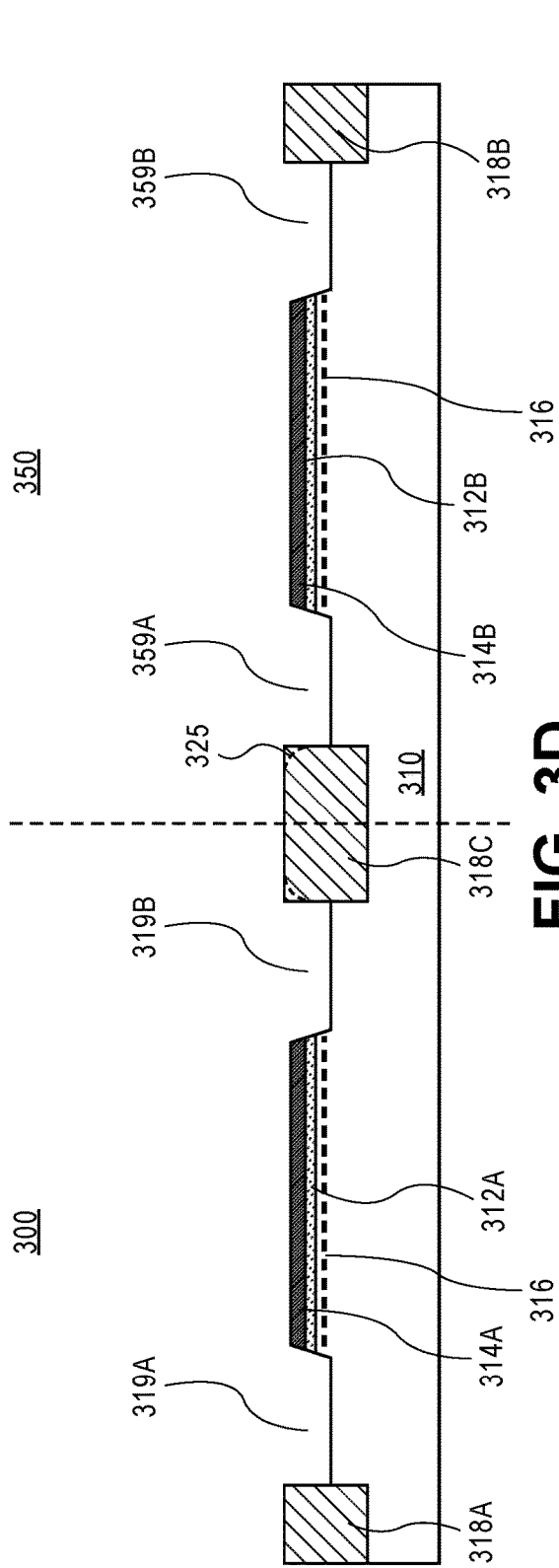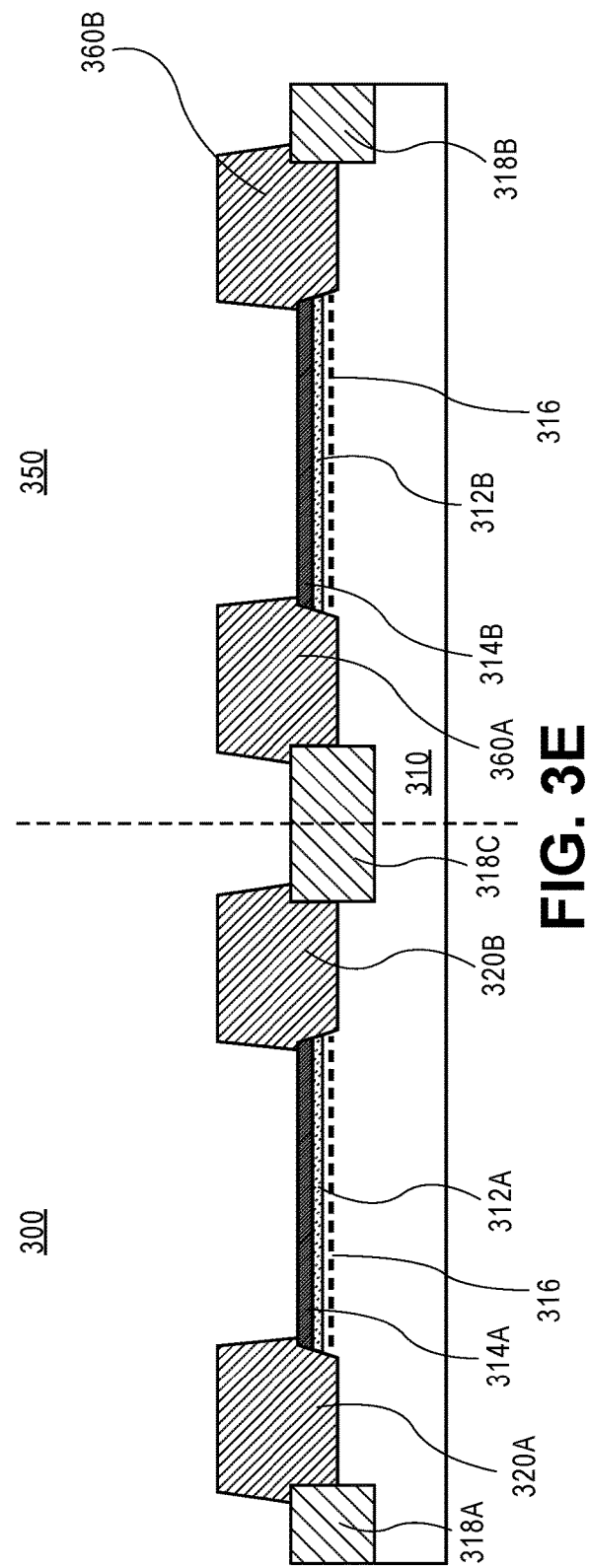

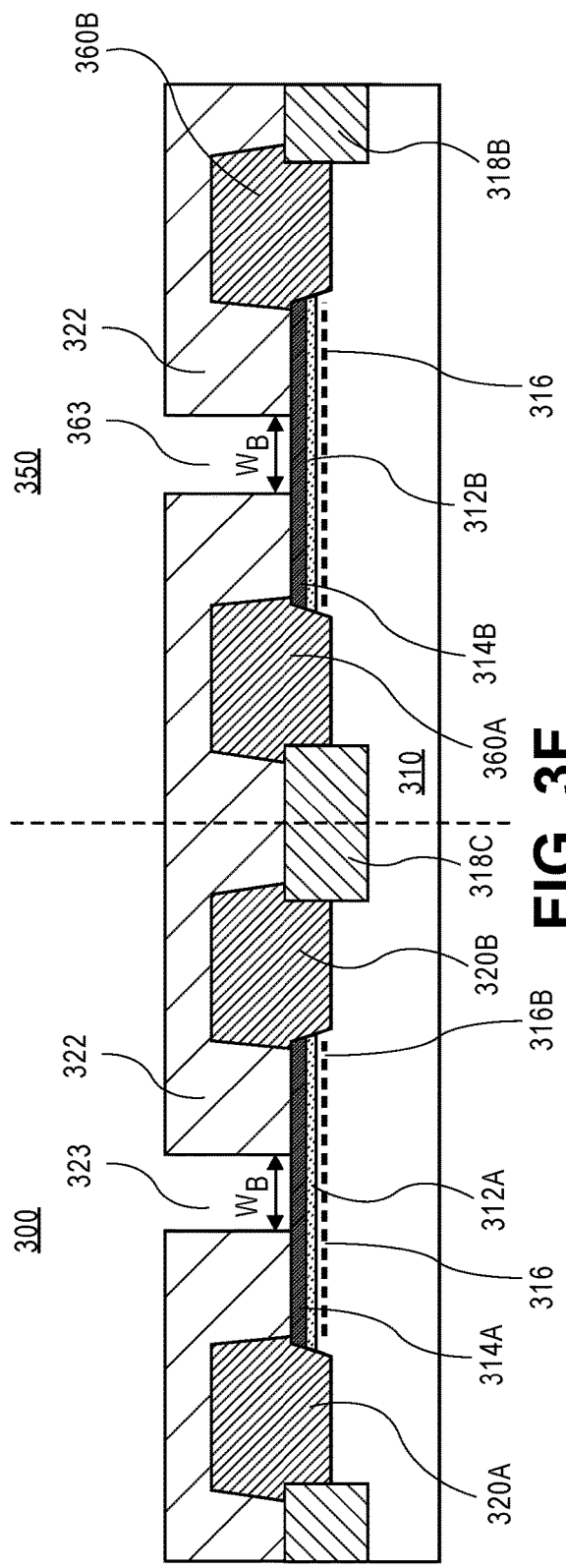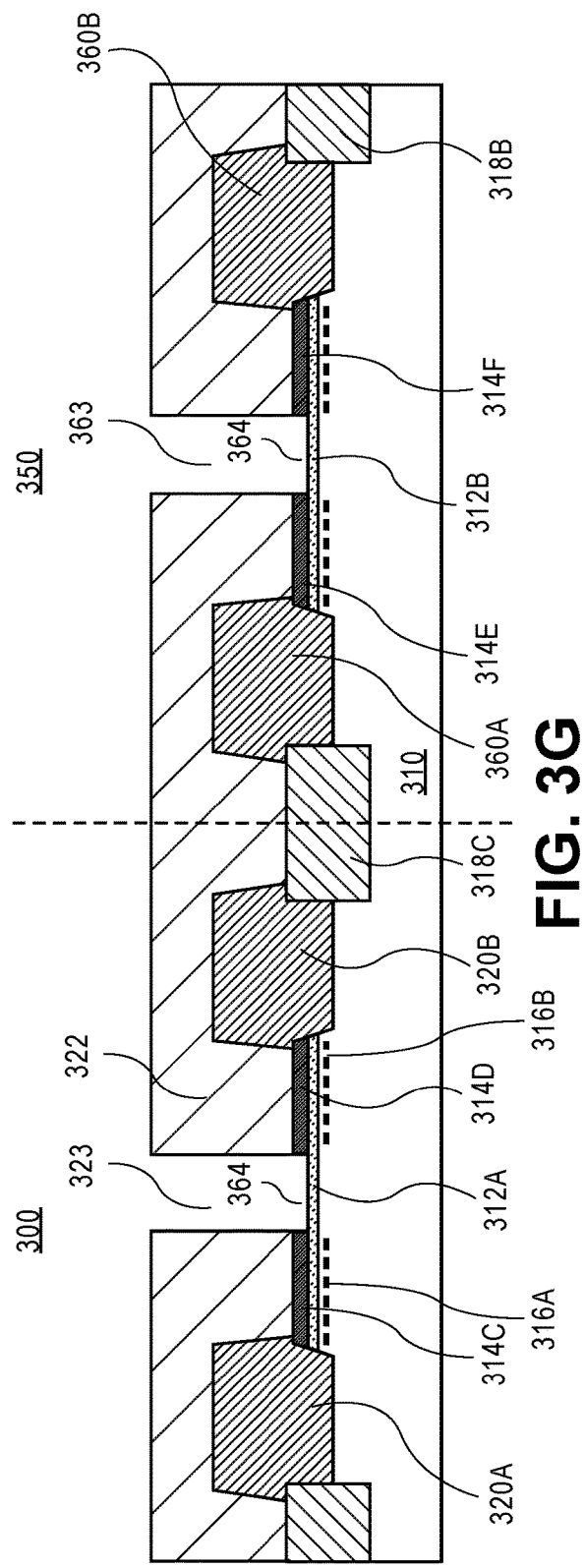

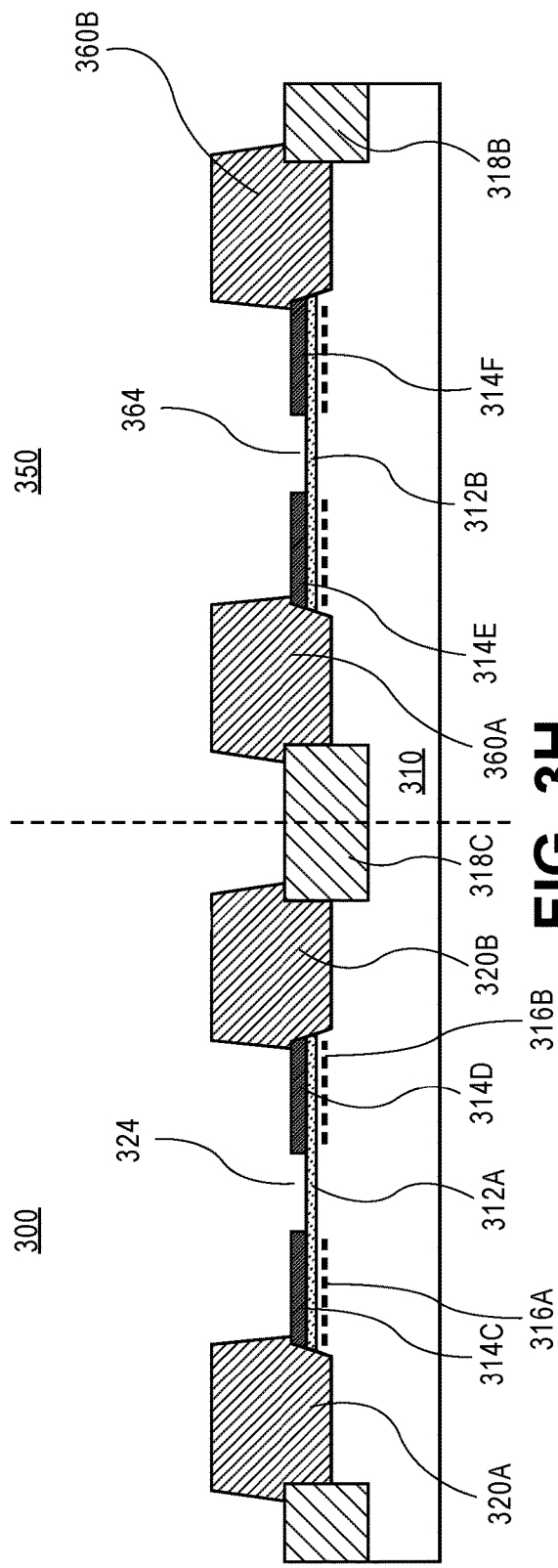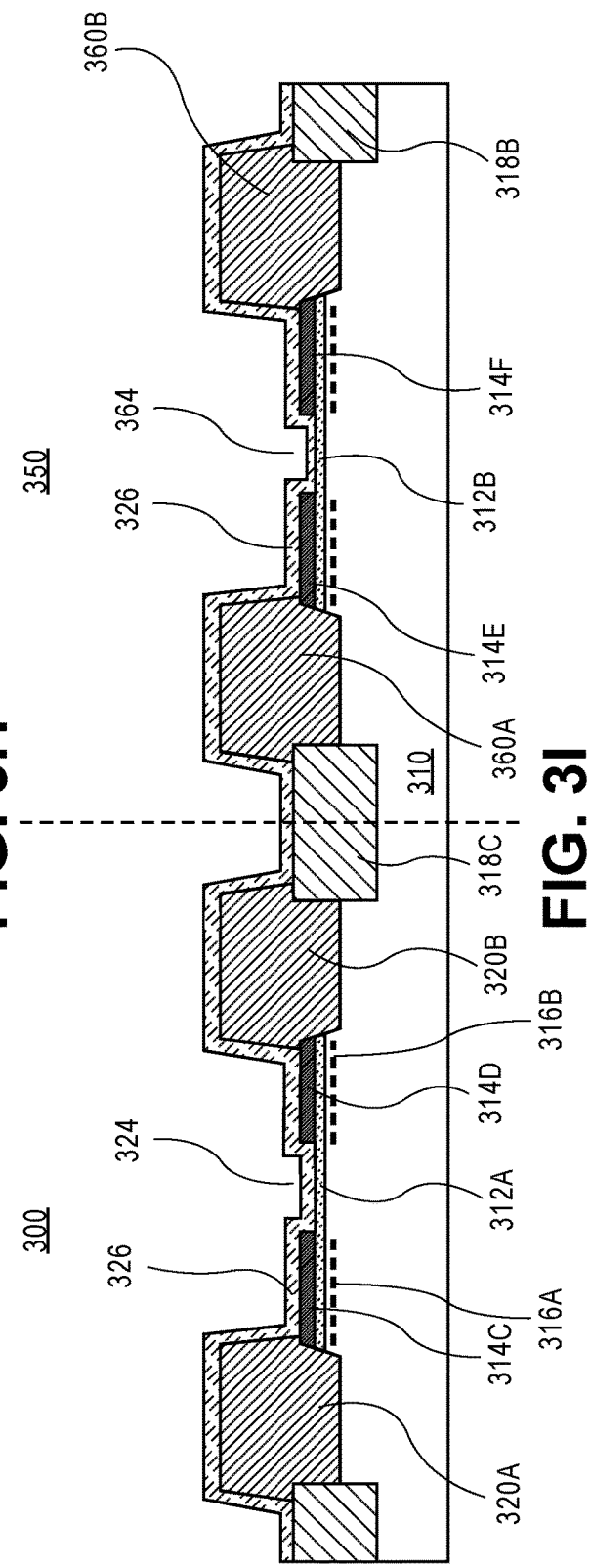

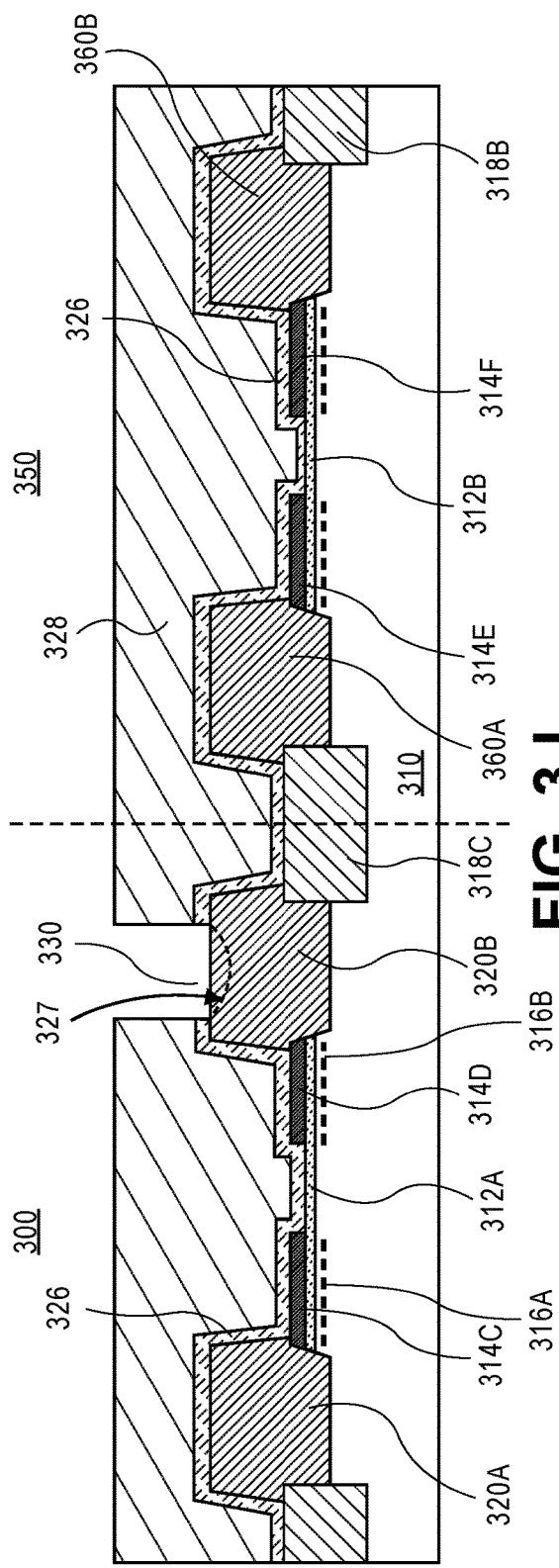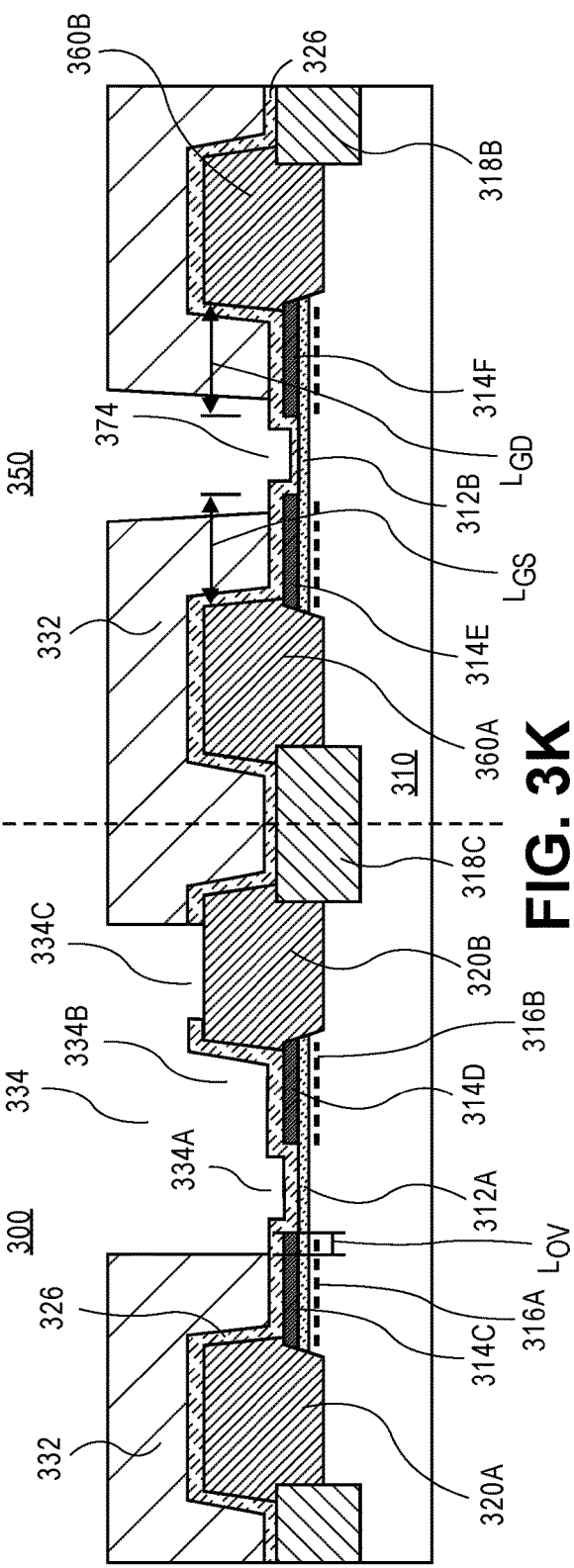

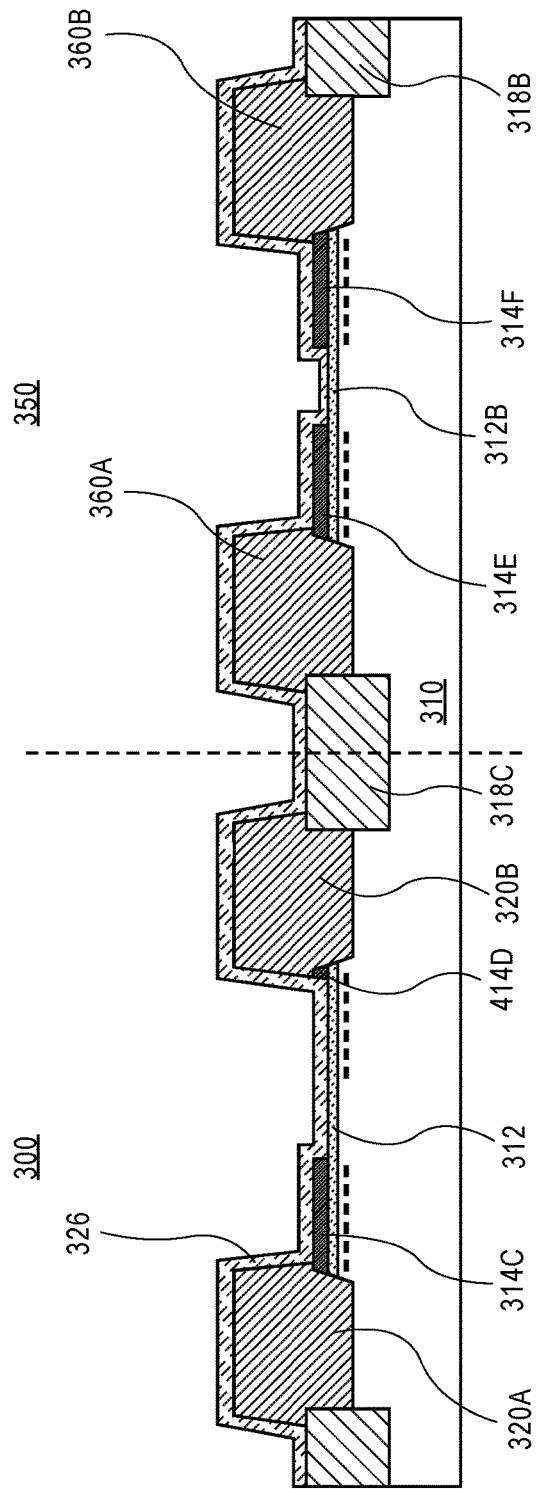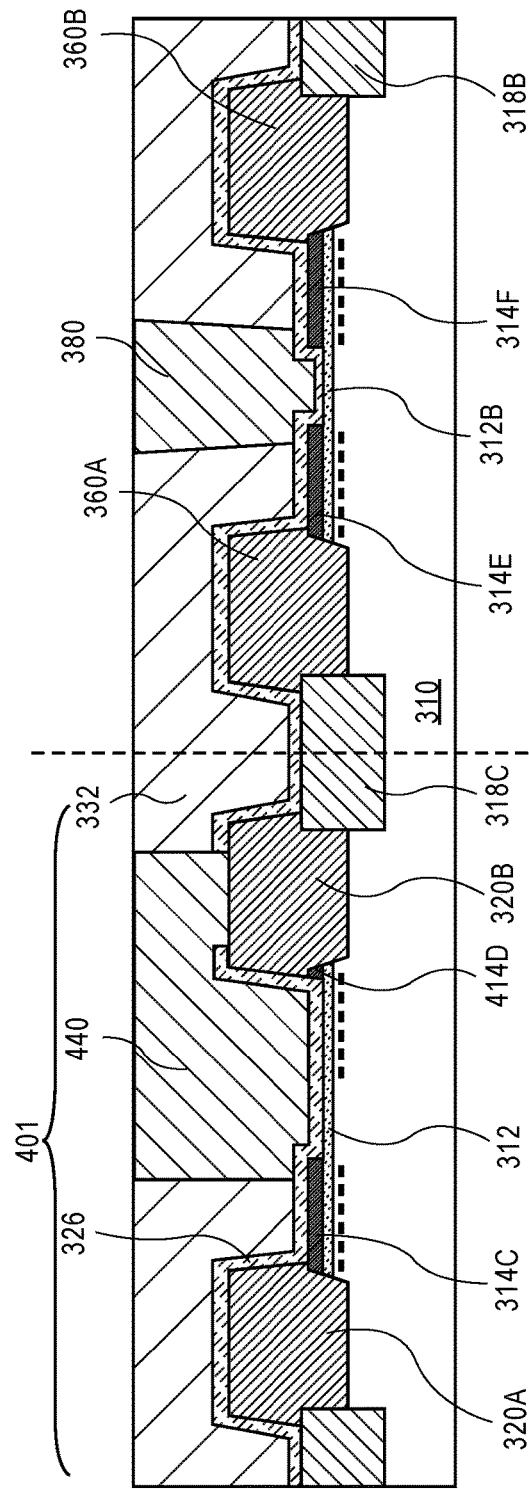

TRANSISTOR CONNECTED DIODES AND CONNECTED III-N DEVICES AND THEIR METHODS OF FABRICATION

CROSS-REFERENCE TO RELATED APPLICATION

This patent application is a U.S. National Phase Application under 35 U.S.C. § 371 of International Application No. PCT/US2016/054964, filed Sep. 30, 2016, entitled "TRANSISTOR CONNECTED DIODES AND CONNECTED III-N DEVICES AND THEIR METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to co-integration of transistor connected diode and group III-N transistor structures and design.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power. However, the transistor gates in particular, may be susceptible to damage due to process-induced charging during the manufacturing process as well as electrostatic discharge (ESD) events that occurs during packaging as well as during normal use. Reliable manufacturing processes that produce such integrated circuits may require some form of electrostatic discharge (ESD) protection to prevent component damage. One form of ESD protection can be obtained by fabrication of a diode connected to a transistor or multiple diodes connected to a single or multiple transistors.

BRIEF DESCRIPTION OF THE DRAWINGS

FIGS. 2A-2E illustrate cross-sectional views representing various operations in a method of forming a material layer stack for fabricating the transistor connected diode and the group III-N transistor.

FIG. 2A illustrates the formation of a plurality of trenches in a dielectric layer formed above a substrate.

FIG. 2B illustrates the structure of FIG. 2A, following the formation of a group III-N semiconductor material in the plurality of trenches and on the uppermost surfaces of the dielectric layer.

FIG. 2C illustrates the structure of FIG. 2B following the formation of a mobility enhancement layer on the upper surface of the group III-N semiconductor material, followed by the formation of a polarization charge inducing layer on the mobility enhancement layer.

FIG. 2D illustrates the structure of FIG. 2C, following the etching of a group III-N semiconductor material.

FIG. 2E illustrates the structure of FIG. 2D, following the process of forming isolation regions adjacent to the patterned group III-N semiconductor material.

FIGS. 3A-3N illustrate cross-sectional views representing various operations in a method of fabricating a transistor connected diode structure and a group III-N transistor on a common substrate such as shown in FIG. 2E.

FIG. 3A illustrates a transistor connected diode region and a group III-N transistor region sharing a common group III-N semiconductor material, a mobility enhancement layer and a polarization charge inducing layer.

FIG. 3B illustrates the structure of FIG. 3A, following an etch process to form a plurality of trenches in the transistor connected diode region and in the group III-N transistor region.

FIG. 3C illustrates the structure of FIG. 3B, following the formation of a plurality of isolation regions in the transistor connected diode region and in the group III-N transistor region.

FIG. 3D illustrates the structure of FIG. 3C, following the formation of trenches in the polarization charge inducing layer, the mobility enhancement layer and the group III-N semiconductor material adjacent to the isolation structures in the transistor connected diode region and the group III-N transistor region.

FIG. 3E illustrates the structure of FIG. 3D, following the formation of a first raised drain structure and a first raised source structure in the transistor connected diode region and the formation of a second raised drain structure and a second raised source structure in the group III-N transistor region.

FIG. 3F illustrates the structure of FIG. 3E, following the formation of a first opening in a masking layer formed in the transistor connected diode region and the formation of a second opening in the masking layer formed in the group III-N transistor region.

FIG. 3G illustrates the structure of FIG. 3F, following the process of etching a portion of the polarization charge inducing layer to form a first gap in the transistor connected diode region and to form a second gap in the group III-N transistor region.

FIG. 3H illustrates the structure of FIG. 3G, following the removal of the masking from the transistor connected diode region and from the group III-N transistor region.

FIG. 3I illustrates the structure of FIG. 3H, following the blanket deposition of a gate dielectric layer in the transistor connected diode region and in the group III-N transistor region.

FIG. 3J illustrates the structure of FIG. 3I, following the removal of the gate dielectric layer in the transistor connected diode region exposing a portion of an uppermost surface of the first raised drain structure.

FIG. 3K illustrates the structure of FIG. 3J, following the formation of a first opening in a dielectric layer formed in the transistor connected diode region and a second opening in the dielectric layer formed in a group III-N transistor region.

FIG. 3N illustrates the structure of FIG. 3M following the formation of a source contact in the transistor connected diode region, and the formation of a source contact and a drain contact in the group III-N transistor region.

FIG. 4B illustrates the structure of 4A, following the formation of a first opening in a dielectric layer formed in the transistor connected diode region and a second opening in the dielectric layer formed in a group III-N transistor region.

FIG. 4C illustrates the structure of 4B, following the formation of a first electrode and a first source contact in the transistor connected diode region and the formation of a gate electrode, a second source contact and a drain contact in the group III-N transistor region.

DESCRIPTION OF THE EMBODIMENTS

Figure 1:
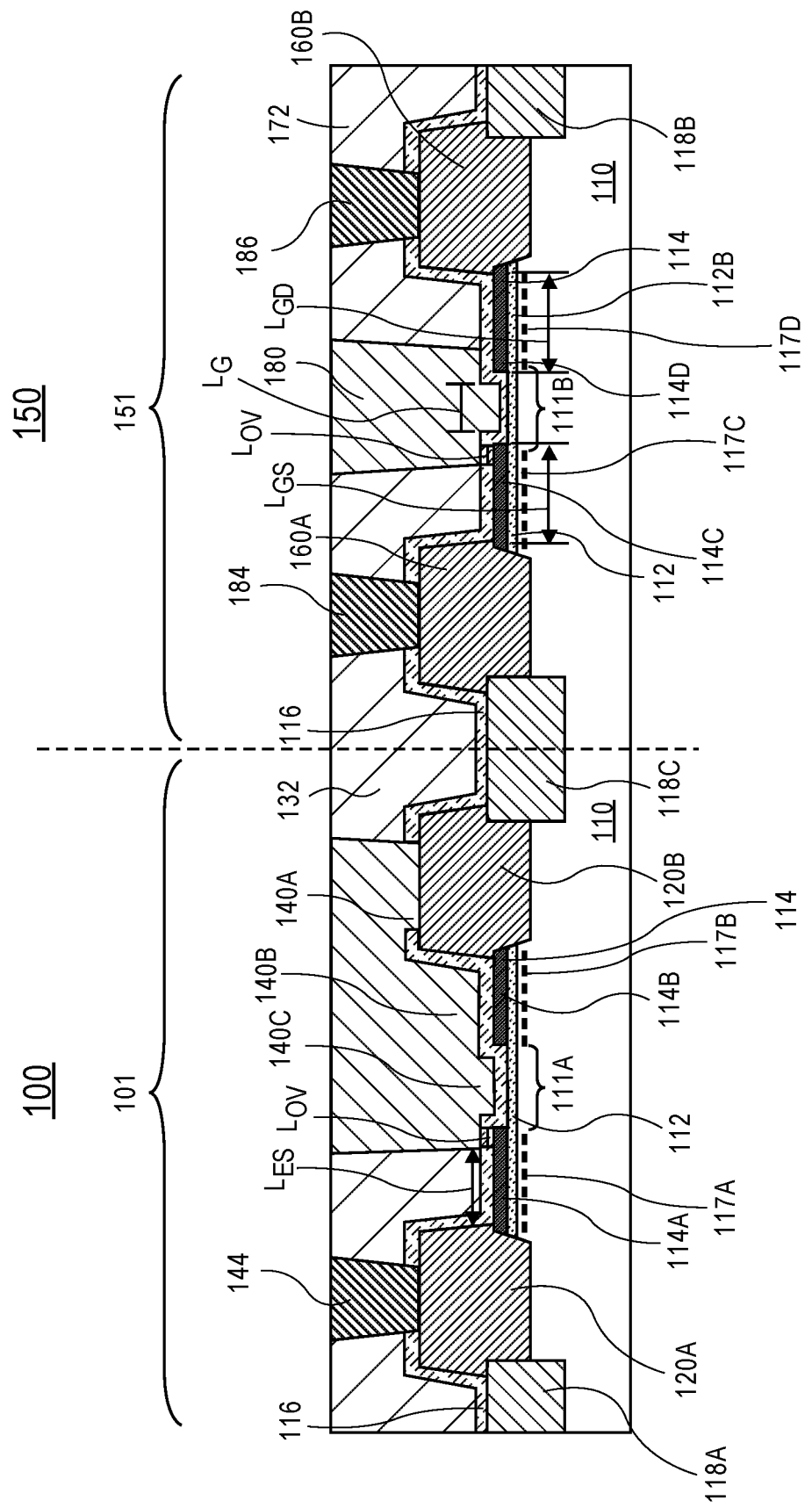
FIG. 1 illustrates a cross-sectional view of a transistor connected diode and a group III-N transistor formed on a substrate, in accordance with an embodiment of the present invention.

Diodes and group III-N transistors for logic, system-on-chip (SoC), radio frequency (RF) components and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as operations associated with group III-N transistor, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Electrostatic discharge (ESD) is one of the most prevalent threats to electronic components. In an ESD event, a large amount of charge is transferred during the fabrication process to a component of a microchip (e.g. transistor, capacitor etc.). The ESD event can lead to large amounts of current to pass through the components of a microchip within a very short period of time. Large amounts of uncontrolled current can cause device degradation and in some cases render the device dysfunctional. Thus, designing and integrating structures to protect integrated circuits against ESD events is an important component of the semiconductor device fabrication process. The problem of ESD becomes even greater when the substrate utilized to build the electronic components cannot discharge the accumulated extra charge adequately. Floating substrates such as SOI or silicon on insulator are especially prone to destruction caused by ESD events. An intrinsic group III-N semiconductor material may be comparable to SOI substrates because of the ability to withstand high dielectric breakdown. In this regard, an electronic device such as a group III-N transistor fabricated on an intrinsic group III-N semiconductor material may require additional components for protection against ESD events. A semiconductor device such as a diode can be readily integrated into the circuitry and may help protect components such as a group III-N transistor. Integration schemes that can co-fabricate a transistor alongside a diode on a common group III-N semiconductor material substrate can offer ESD protection, provide significant process advantages and potentially offer cost benefits.

In an embodiment, a transistor connected diode is fabricated on a group III-N semiconductor material that is disposed on a substrate. The transistor connected diode has a raised source structure and a raised drain structure that is disposed on the group III-N semiconductor material. A mobility enhancement layer is disposed on the group III-N semiconductor material, between the raised source structure and the raised drain structure. A polarization charge inducing layer is disposed on the mobility enhancement layer between the raised source structure and the raised drain structure. The polarization charge inducing layer has a first portion and a second portion that are separated by a gap. A gate dielectric layer is disposed on the mobility enhancement layer in the gap. A first metal electrode has a first portion disposed on the raised drain structure, a second portion disposed above the second portion of the polarization charge inducing layer and a third portion disposed on the gate dielectric layer in the gap. A second metal electrode is disposed on the raised source structure.

In an embodiment, a group III-N transistor is co-fabricated alongside the transistor connected diode. The group III-N transistor includes three independent terminals: a gate electrode, a conductive raised source structure and a conductive raised drain structure. The group III-N transistor is almost identically configured as the transistor connected diode, with an important distinction. The gate electrode, which is formed above the gap, is not connected to the conductive raised drain structure. In an embodiment, by connecting the first metal electrode of the transistor connected diode with the group III-N transistor, the transistor connected diode can divert large current flow (from an ESD event) away from the group III-N transistor. In other embodiments, the transistor connected diode is connected in a way such that large currents from the group III-N transistor may be favorably discharged without damaging the group III-N transistor.

FIG. 1 illustrates a cross-sectional view of a transistor connected diode 101 and a group III-N transistor 151 disposed on a group III-N semiconductor material 110, in accordance with an embodiment of the present invention. The transistor connected diode 101 of FIG. 1 includes a first raised source structure 120A and a first raised drain structure 120B disposed on the group III-N semiconductor material 110 in a transistor connected diode region 100. A first portion 112A of a mobility enhancement layer 112 is disposed on the group III-N semiconductor material 110, between the first raised source structure 120A and the first raised drain structure 120B. A polarization charge inducing layer 114 is disposed on the first portion 112A of the mobility enhancement layer 112 between the first raised source structure 120A and the first raised drain structure 120B. The polarization charge inducing layer 114 has a first portion 114A and a second portion 114B that are separated by a first gap 111A. The first and second portions 114A and 114B of the polarization charge inducing layer 114 induces strain in the group III-N semiconductor material 110. The induced strain leads to 2 DEG (represented by dashed lines 117) in the group III-N semiconductor material 110. The absence of a polarization charge inducing layer 114 in the first gap 111A leads to an absence of a 2 DEG under the first gap 111A. A gate dielectric layer 116 is disposed on the mobility enhancement layer 112A in the first gap 111A. A first metal electrode 140 extends continuously from above the first gap 111A to above the first raised drain structure 120B. The first metal electrode 140 has a first portion 140A that is disposed on the raised drain structure 120B. The first metal electrode 140 has a second portion 140B that is disposed above the second portion 114B of the polarization charge inducing layer 114. The first metal electrode 140 has a third portion 140C that is disposed on the gate dielectric layer 116 in the first gap 111A. A second metal electrode 144 is disposed on the raised source structure 120A.

FIG. 1 illustrates a cross-sectional view of a diode 101 and a group III-N transistor 151 disposed on a group III-N semiconductor material 110, in accordance with an embodiment of the present invention. The diode 101 of FIG. 1 includes a first raised source structure 120A and a first raised drain structure 120B disposed on the group III-N semiconductor material 110 in a diode region 100. A first portion 112A of a mobility enhancement layer 112 is disposed on the group III-N semiconductor material 110, between the first raised source structure 120A and the first raised drain structure 120B. A polarization charge inducing layer 114 is disposed on the first portion 112A of the mobility enhancement layer 112 between the first raised source structure 120A and the first raised drain structure 120B. The polarization charge inducing layer 114 has a first portion 114A and a second portion 114B that are separated by a first gap 111A. The first and second portions 114A and 114B of the polarization charge inducing layer 114 induces the formation of 2 DEG (represented by dashed lines 117) in the group III-N semiconductor material 110. The absence of a polarization charge inducing layer 114 in the first gap 111A leads to an absence of a 2 DEG under the first gap 111A. A gate dielectric layer 116 is disposed on the mobility enhancement layer 112A in the first gap 111A. A first metal electrode 140 extends continuously from above the first gap 111A to above the first raised drain structure 120B. The first metal electrode 140 has a first portion 140A that is disposed on the raised drain structure 120B. The first metal electrode 140 has a second portion 140B that is disposed above the second portion 114B of the polarization charge inducing layer 114. The first metal electrode 140 has a third portion 140C that is disposed on the gate dielectric layer 116 in the first gap 111A. A second metal electrode 144 is disposed on the raised source structure 120A.

In an embodiment, the gate dielectric layer 116 is further disposed on the sloped sidewalls and on an uppermost portion of the first raised drain structure 120B. In an embodiment, the dielectric layer 116 is disposed on the first portion 114A and the second portion 114B of the polarization charge inducing layer 114 of the transistor connected diode 101. Additionally, in an embodiment, the gate dielectric layer 116 is disposed on the sloped sidewalls and on the uppermost surface of the first raised source structure 120A.

In an embodiment, a portion of the first metal electrode 140 extends beyond the first gap 111A and onto the gate dielectric layer 116 that is above the first portion 114A of the polarization charge inducing layer 114 as illustrated in FIG. 1. The amount of overlap between the first metal electrode 140 and the first portion 114A of the polarization charge inducing layer 114 is denoted as $L_{OV}$. In one such embodiment, the first metal electrode 140 overlaps with the first portion 114A of the polarization charge inducing layer 114. The overlap leads to stray gate capacitance. In an embodiment, when the first metal electrode is biased at 2V the gate capacitance has a value in the range of 1.2 e-6 F/cm$^2$-1.6 e-6 F/cm$^2$. In an embodiment, a stray gate capacitance of less than 10% of the total gate capacitance is desirable for optimal functionality of the transistor connected diode 101. In an embodiment, an overlap, $L_{OV}$, of less than 10 nm can limit the stray gate capacitance to below 10%. Additionally, in one such embodiment, the first metal electrode 140 is separated from the first raised source structure 120A by a distance $L_{ES}$, denoted as a first metal electrode to source separation distance. In an embodiment, the distance, $L_{ES}$, influences the breakdown voltage, $V_{BD}$, between the first metal electrode 140 and the first raised source structure 120A. In an embodiment, the distance $L_{ES}$ of at least 100 nm enables the breakdown voltage to be greater than 8V. In an embodiment, as illustrated in FIG. 1, a portion 140B of the first metal electrode 140 extends over the gate dielectric layer 116 disposed on the second portion 114B of the polarization charge inducing layer 114.

In an embodiment, the polarization charge inducing layer 114 introduces a polarization difference in the top surface of the group III-N semiconductor material 110 creating a conducting sheet of charge known as a 2 dimensional electron gas (2 DEG—represented by dashed lines 117) in the group III-N semiconductor material 110. A gap 111A in the polarization charge inducing layer 114 leads to an absence of 2 DEG beneath the gap 111A in the group III-N semiconductor material 110. By positively biasing the first metal electrode 140 relative to the first raised source structure 120A, a 2 DEG is established in the group III-N semiconductor material 110 underneath the gap 111A. The presence of the 2 DEG leads to current conduction between the first metal electrode to the adjacent (n-doped) first raised source structure 120A in the transistor connected diode 101. The raised drain structure 120B is biased to the same voltage as the first metal electrode 140.

In an embodiment, the group III-N transistor 151 is fabricated alongside a transistor connected diode 101. The group III-N transistor 151 is disposed on the group III-N semiconductor material 110 in a group III-N transistor region 150. The group III-N transistor 151 includes a second raised source structure 160A and a second raised drain structure 160B disposed on the group III-N semiconductor material 110. A second portion 112B of the mobility enhancement layer 112 is disposed on the group III-N semiconductor material 110, between the second raised source structure 160A and the second raised drain structure 160B. The polarization charge inducing layer 114 is disposed on the mobility enhancement layer 112B between the second raised source structure 160A and the second raised drain structure 160B. The polarization charge inducing layer 114 has a third portion 114C and a fourth portion 114D separated by a second gap 111B. The third and fourth portions 114C and 114D of the polarization charge inducing layer 114 lead to formation of 2 DEG in the group III-N semiconductor material 110. The gate dielectric layer 116 is disposed on the second portion 112B of the mobility enhancement layer 112 in the second gap 111B. A gate electrode 180 is disposed on the gate dielectric layer 116 above the second gap 111B between the second raised drain structure 160B and the second raised source structure 160A. A source contact 184 is disposed on the second raised source structure 160A. A drain contact 186 is disposed on the second raised drain structure 160B.

In an embodiment, the gate dielectric layer 116 is disposed on the sloped sidewalls and on the uppermost surface of the second raised source 160A as illustrated in FIG. 1. In one embodiment, the gate dielectric layer 116 is further disposed on the third portion 114C and fourth portion 114D of the polarization charge inducing layer 114. In an embodiment, gate dielectric layer 116 is also disposed on the sloped sidewalls and on the uppermost surface of the second raised drain structure 160B.

In an embodiment, the group III-N transistor 151 has a gate electrode 180 with portions that extend on opposite sides of the second gap 111B by a distance $L_{OV}$. In one such embodiment, the gate electrode 180 overlaps with the second portion 114B of the polarization charge inducing layer 114. In an embodiment, the overlap $L_{OV}$, leads to stray gate capacitance as discussed above. In an embodiment, an overlap of less than 10 nm can limit the stray gate capacitance to below 10%. The gate electrode 180 is distant from the second raised drain structure 160B by a distance $L_{GD}$, denoted as a gate to drain separation distance. The gate electrode 180 is distant from the second raised source structure 160A by a distance $L_{GS}$, denoted as a gate to source separation distance. In an embodiment, the distances $L_{GD}$ and $L_{GS}$ are of equal lengths as illustrated in FIG. 1. In other embodiments, the distances $L_{GD}$ and $L_{GS}$ are of unequal lengths. The distance $L_{GD}$, influences the breakdown voltage, $V_{BD}$ between the gate electrode 180 and the second raised drain structure 160B. In an embodiment, an $L_{GD}$ of at least 100 nm enables the group III-N transistor 151 to have a breakdown voltage that is greater than 8V.

In the group III-N transistor an electric field, is created by biasing the gate electrode above a threshold voltage, $V_T$. When the gate voltage is equal to or greater than a threshold voltage, $V_T$, to form a channel in the group III-N semiconductor material 110, below the second gap 111B, current will flow from the second raised drain structure 160B to the raised source structure 160A.

As is depicted in FIG. 1, in an embodiment, a first isolation region 118C is disposed in the group III-N semiconductor material 110, between the transistor connected diode region 100 and the group III-N transistor region 150. The first isolation region 118C is between one of the first raised drain structure 120B or the first raised source structure 120B of the transistor connected diode 101 and one of the second raised source structure 160A or the second raised drain structure 160B of the group III-N transistor structure. In an embodiment, the first isolation region 118C is adjacent to the first raised drain structure 120B of the transistor connected diode 101 and adjacent to the second raised source structure 160A of the group III-N transistor 151, as depicted in FIG. 1. It is to be appreciated that the first isolation region 118C electrically isolates the transistor connected diode 101 disposed in the transistor connected diode region 100 from the group III-N transistor 151 disposed in the group III-N transistor region 150.

In an embodiment, the gate dielectric layer 116 is disposed on the uppermost surface of the first isolation region 118C which separates the transistor connected diode 101 from the group III-N transistor 151, as is depicted in FIG. 1. The gate dielectric layer is disposed on the isolation region 118C and on the one of the first raised drain structure 120B and the first raised source structure 120A and on the one of the second raised drain structure 160B and second raised source structure 160A.

In an embodiment, the first metal electrode 140 and gate electrode 180 include a metal such as but not limited to Pt, Ni or an alloy such as TiN or TaN. In an embodiment, the first metal electrode 140 and the gate electrode 180 include a work function metal and a gate cap metal. In an embodiment, when the first metal electrode 140 and the gate electrode 180 include a work function metal as well as a gate cap metal, the work function metal includes a metal such as but not limited to Pt, Ni or an alloy such as TiN or TaN. In one such embodiment, the work function metal has a thickness approximately in the range of 10-40 nm. In one such embodiment, the gate cap metal is tungsten. In an embodiment, the gate cap metal has a thickness that is approximately in the range of 30-50 nm. In an embodiment, the gate dielectric layer 116 includes a dielectric material such as but not limited to $Al_2O_3$, $HfO_2$, $ZrO_2$, $TiSiO$, $HfSiO$ or $Si_3N_4$. In an embodiment, the gate dielectric layer 116 has a thickness that is approximately in the range of 2 nm-10 nm.

Referring to FIG. 1, the group III-N semiconductor material 110 is disposed above a substrate (not shown). In an embodiment, the group III-N semiconductor material 110 is a GaN layer. In one such embodiment, the group III-N semiconductor material 110 has a relatively high carrier mobility, (greater than 500 cm² V⁻¹). In one such embodiment, the group III-N semiconductor material 110 is a substantially undoped group III-nitride material (i.e., $O_2$ impurity concentration minimized) for minimal impurity scattering. In other embodiments, group III-N semiconductor material 110 includes one or more ternary alloys of GaN, such as AlGaN, AlInN, or a quaternary alloy of GaN including at least one group III element and nitrogen, such as $In_xAl_yGa_{1-x-y}N$. where x ranges from 0.01-0.1 and y ranges from 0.01-0.1. In an embodiment, the group III-N semiconductor material 110 has a material thickness approximately in the range of 100 nm-5 um.

Referring to FIG. 1, the mobility enhancement layer 112 is disposed on the group III-N semiconductor material 110. In an embodiment, the mobility enhancement layer 112 includes a group III-N semiconductor material such as but not limited to AlN, InAlN or AlGaN. In an embodiment, the mobility enhancement layer 112 has an insufficient thickness to introduce 2 DEG. In an embodiment, the mobility enhancement layer 112 has a thickness that is less than 1 nm to prevent the introduction of strain on the underlying group III-N semiconductor material 110. In an embodiment, the mobility enhancement layer 112 and the underlying group III-N semiconductor material 110 are binary alloys. In one such embodiment, when the mobility enhancement layer 112 and the underlying group III-N semiconductor material 110 are binary alloys, enhanced electron confinement can result in the group III-N semiconductor material 110. Enhanced electron mobility may be a result of reduced alloy scattering. In one such embodiment, the mobility enhancement layer 112 is an AlN layer and the underlying group III-N semiconductor material 110 is GaN. In an embodiment, the AlN mobility enhancement layer 112 has a bandgap that is greater than the bandgap of the GaN group III-N semiconductor material 110. In one such embodiment, the AlN mobility enhancement layer 112 has a bandgap (6.02 eV) that is wider than the bandgap of the GaN group III-N semiconductor material 110 (3.4 eV), facilitating a quantum well at the interface between the AlN mobility enhancement layer 112 and the GaN group III-N semiconductor material 110. In one such embodiment, the presence of the quantum well and reduced alloy scattering enables enhanced electron mobility in the group III-N semiconductor material 110.

Referring again to FIG. 1, in an embodiment, the polarization charge inducing layer 114 includes a suitable group III-N material which induces a 2 DEG effect in the group III-N semiconductor material 110. In an embodiment, the polarization charge inducing layer 114 includes a material such as but not limited to $Al_zGa_{1-z}N$, $Al_wIn_{1-w}N$, or AlN, where Z ranges from 0.2-0.3 and W ranges from 0.7-0.85. In an embodiment, the polarization charge inducing layer 114 has a thickness greater than a minimum thickness needed to induce a 2 DEG effect in the group III-N semiconductor material 110. In one such embodiment, the polarization charge inducing layer 114 has a thickness that is approximately in the range of 3-20 nm. In an embodiment, the polarization charge inducing layer 114 is AlGaN and the group III-N semiconductor material 110 is GaN. In one such embodiment, the AlGaN polarization charge inducing layer 114 has a thickness that is approximately in the range of 3 nm-5 nm. In an embodiment, the mobility enhancement layer 112 is AlN, the polarization charge inducing layer 114 is AlGaN and the group III-N semiconductor material 110 is GaN. In one such embodiment, the AlN mobility enhancement layer has a thickness that is less than 1.1 nm and the AlGaN polarization charge inducing layer 114 has a thickness that is in the range of 3 nm-5 nm.

In an embodiment, the first raised source structure 120A, first raised drain structure 120B, second raised source structure 160A and second raised drain structure 160B have uppermost surfaces that are above the level of the polarization charge inducing layer 114 and the isolation regions 118A, 118B and 118C, as illustrated in FIG. 1. In an embodiment, the first raised source structure 120A, first raised drain structure 120B, second raised source structure 160A and second raised drain structure 160B include a group III-N semiconductor material such as but not limited to GaN or InGaN. In an embodiment, the first raised source structure 120A, first raised drain structure 120B, second raised source structure 160A and second raised drain structure 160B includes a dopant species that is an n-type dopant. In a specific embodiment, the n-type dopant includes a material such as Si or Ge. In one such embodiment, the n-type dopant material is silicon. In one such embodiment, the n-type dopant is silicon and the first and second raised source and first and second raised drain structures, 120A, 160A, 120B, 160B respectively, have an n-dopant density of at least 1 e19/cm³. In an embodiment, the first raised source structure 120A, first raised drain structure 120B, second raised source structure 160A and second raised drain structure 160B have a thickness that is approximately in the range of 100-200 nm and a width that is approximately 100 nm-200 nm. In an embodiment, a combination of the height and width of the second raised source and drain structures 160A and 160B respectively, and the n-type dopant density are chosen to achieve a specific contact resistance value that is designed to achieve a group III-N transistor drive current of at least 1 mA/um. In one such embodiment, the second raised source and drain structures 160A and 160B have contact resistance values that are less than 200 ohms-micron/side.

In an embodiment, the second metal electrode 144, the source contact 184, and the drain contact 186 include a multi-layer stack. In an embodiment, the multi-layer stack includes two or more distinct layers of metal. In one such embodiment, the multi-layer stack includes metals such as Ti or Al. In other embodiments, the multi-layer stack includes a conductive cap. In one such embodiment, the conductive cap includes a conductive material such as but not limited to tungsten or Cu.

In an embodiment, the isolation regions 118A, 118B and 118C include a dielectric material such as but not limited to silicon oxide, silicon oxynitride, or carbon doped oxide. In an embodiment, the isolation regions 118A, 118B and 118C have a thickness that is approximately in the range of 150-200 nm.

In an embodiment, the transistor connected diode 101 is electrically coupled with other the transistor connected diodes to form a transistor connected diode array. Likewise, the group III-N transistor 151 may be electrically coupled with other the group III-N transistors to form a group III-N transistor circuit. In one such embodiment, the transistor connected diode array is connected to a group III-N transistor circuit. In one such embodiment, the first metal electrode 140 of the transistor connected diode 101 in the transistor connected diode array is coupled to the one of the second raised drain structure 160B or the second raised source structure 160A of the group III-N transistor 151 in the group III-N transistor circuit.

FIGS. 2A-2E illustrate cross-sectional views representing various operations in a method of forming a material layer stack for fabricating a transistor connected diode structure and/or a group III-N transistor structure in accordance with embodiments of the present invention.

Figure 2A:
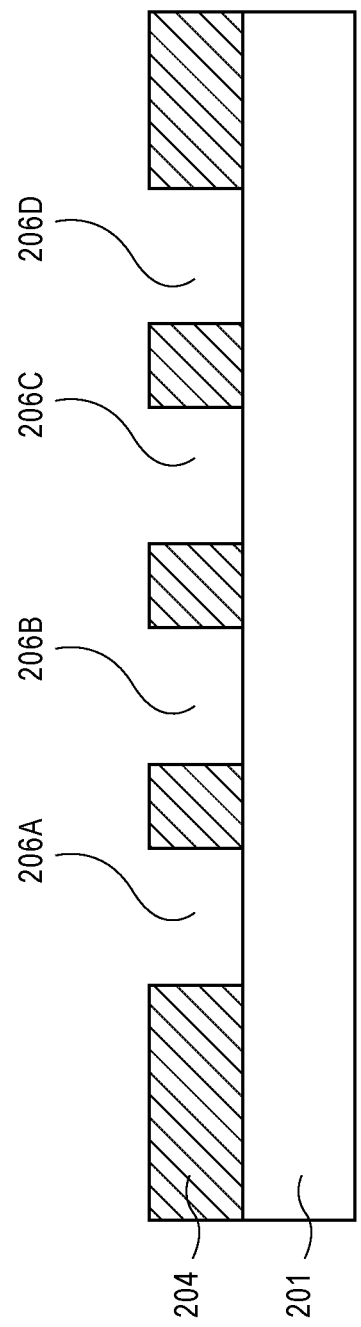
Figure 2B:
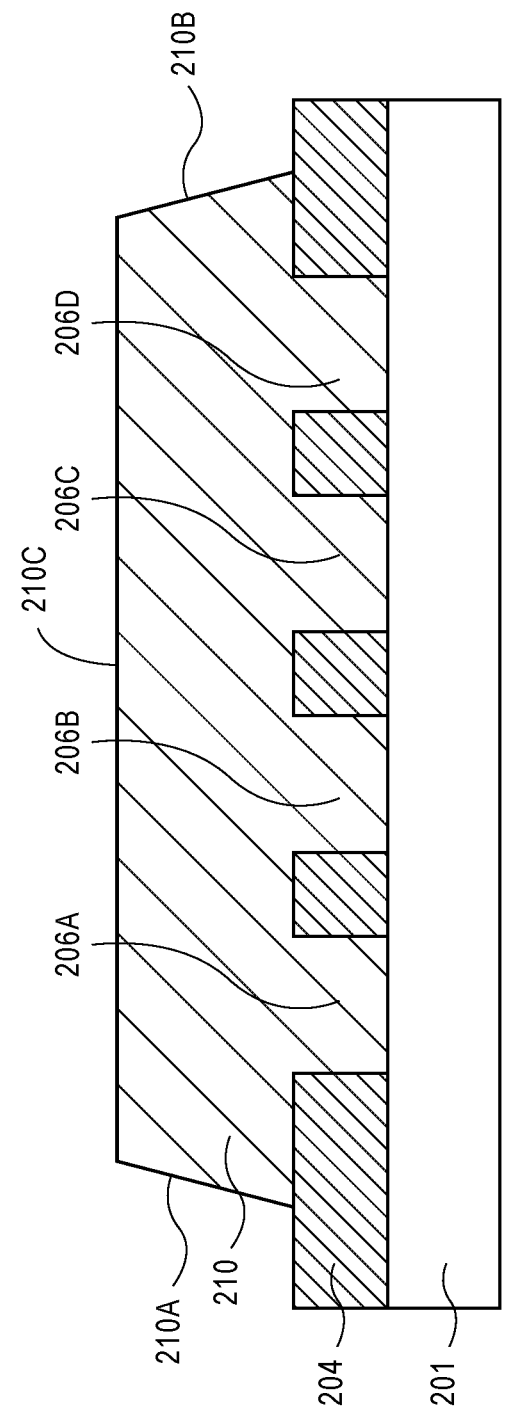

FIG. 2A illustrates the formation of a plurality of trenches 206A, 206B, 206C and 206D in a dielectric layer 204 formed above a substrate 201. In an embodiment, each of the trenches 206A, 206B, 206C and 206D are formed by first forming a dielectric layer 204 on a substrate 201, followed by the formation of a mask on the dielectric layer 204 and subsequently etching the dielectric layer 204. In an embodiment, the masking process defines trenches that are approximately 100 nm-200 nm in width. In an embodiment, dielectric layer 204 includes materials such as, but not limited to silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer 204 may include pores or air gaps to further reduce their dielectric constant. In an embodiment, dielectric layer 204 is formed using a deposition technique such as but not limited to plasma enhanced chemical vapor deposition (PECVD), chemical vapor deposition (CVD) or vertical diffusion furnace (VDF). In an embodiment, dielectric layer 204 has a thickness approximately in the range of 50 nm-200 nm. In an embodiment, the thickness of the dielectric layer 204 and the width of the trenches 206A, 206B, 206C and 206D are accommodated to facilitate a defect free subsequent growth process of the group III-N semiconductor material 210 (as illustrated in FIG. 2B). In one such embodiment the dielectric layer 204 has a thickness of approximately 100 nm-150 nm and the trenches 206A, 206B, 206C and 206D have a width that is approximately 100 nm-200 nm wide. In an embodiment, the substrate 201 includes a semiconductor material such as but not limited to silicon, silicon germanium (Ge) or silicon carbide (SiC).

Referring again to FIG. 2A, in an embodiment, a plasma etch process is utilized to form trenches 206A, 206B, 206C and 206D. In an embodiment, the plasma etch process utilizes process gases such as but not limited to $CF_X$, $CH_XF_Y$, CO, $O_2$, $N_2$ or Ar. In an embodiment, the dielectric layer 204 is a silicon dioxide and the substrate 201 is a silicon substrate. In one such embodiment, a combination of $C_4F_8$, $CH_XF_Y$, CO, $O_2$ and Ar process gases is used to etch vertical trenches in a silicon dioxide dielectric layer 204 with a selectivity greater than 10:1 to an underlying silicon substrate 201.

FIG. 2B illustrates the structure of FIG. 2A, following the formation of a group III-N semiconductor material 210 in the plurality of trenches 206A, 206B, 206C and 206D and on the uppermost surfaces of the dielectric layer 204. In an embodiment, group III-N semiconductor material 210 is formed using a metal organic chemical vapor deposition (MOCVD) process. In an embodiment, the group III-N semiconductor material 210 is grown by an MOCVD process at a temperature in the range of 1000-1100 degrees Celsius. In an embodiment, the group III-N semiconductor material 210 is formed on the substrate 201. The MOCVD growth process causes the group III-N semiconductor material 210 to fill the trenches 206A, 206B, 206C and 206D. The group III-N semiconductor material 210 also grows over the uppermost surfaces of the dielectric layer 204, a process known as lateral epitaxial overgrowth (LEO). In an embodiment, the group III-N semiconductor material 210 is grown to have sidewalls 210A and 210B that are sloped, and an uppermost surface 210C that is substantially flat. In an embodiment, sloped sidewalls 210A and 210B each have a sidewall angle that is at least 50 degrees relative to the top surface of the dielectric layer 204. In an embodiment, the group III-N semiconductor material 210 has a material composition such as is described above in association with group III-N semiconductor material 110. In an embodiment, the group III-N semiconductor material 210 is a GaN layer. In an embodiment, the GaN group III-N semiconductor material 210 is grown to a thickness that is approximately in the range of 100 nm-5 micrometers. In an embodiment, group III-N semiconductor material 210 has a defect density less than (1 e10/cm2). In one embodiment, group III-N semiconductor material 210 is formed to a thickness of at least 100 nm to provide a defect free layer.

Figure 2C:
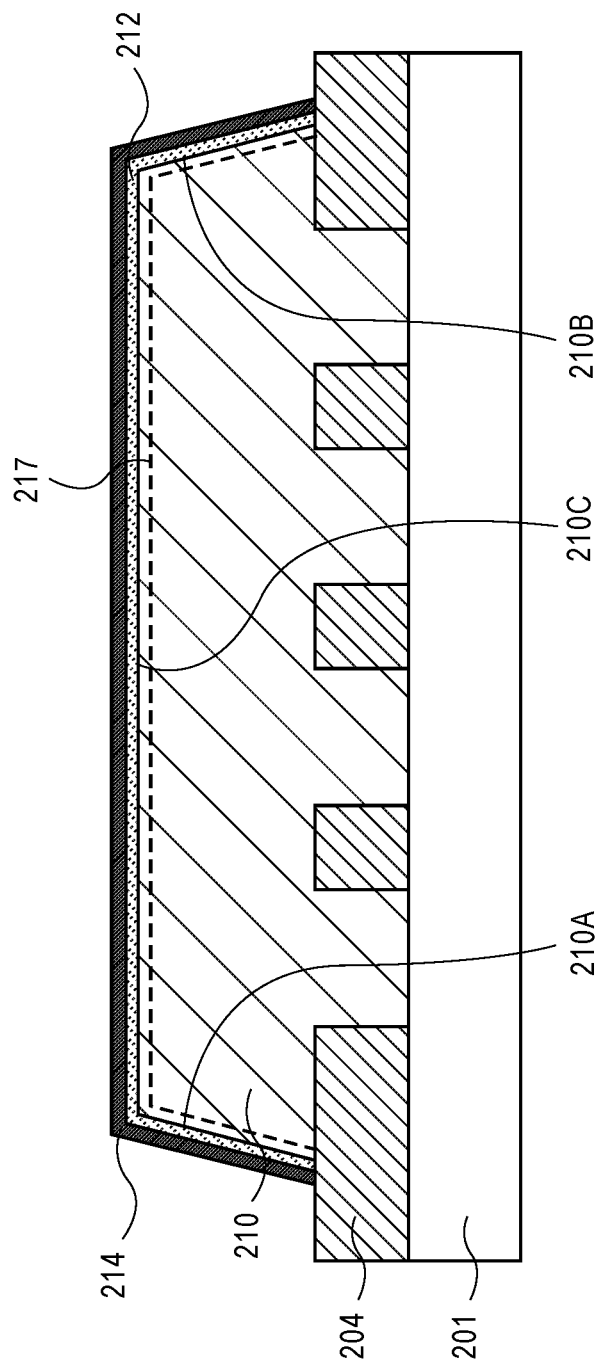

FIG. 2C illustrates the structure of FIG. 2B following the formation of a mobility enhancement layer 212 on the upper surface of the group III-N semiconductor material 210, followed by the formation of a polarization charge inducing layer 214 on the mobility enhancement layer 212. In an embodiment, mobility enhancement layer 212 is formed by metal organic chemical vapor deposition (MOCVD). In an embodiment, the mobility enhancement layer 212 is grown by a MOCVD process at a temperature in the range of 1000-1100 degrees Celsius. In an embodiment, the MOCVD growth process leads to conformal growth of the mobility enhancement layer 212 on the sloped sidewalls 210A and 210B and on the uppermost surface 210C of the group III-N semiconductor material 210. In an embodiment, the mobility enhancement layer 212 has a thickness that is approximately 1 nm or less. In other embodiments, the MOCVD growth condition does not result in a conformal growth of the mobility enhancement layer 212. In one such embodiment, the MOCVD growth process leads to a mobility enhancement layer 212 having a thickness that is that is approximately 1 nm or less on the uppermost surface 210C of the group III-N semiconductor material 210 and in the range of 0 Angstroms-4 Angstroms on the sidewalls 210A and 210B of the group III-N semiconductor material 210. In an embodiment, the mobility enhancement layer includes a material such as but not limited to AlN, InAlN or AlGaN. In an embodiment, the mobility enhancement layer 212 is AlN. In an embodiment, the mobility enhancement layer 212 is AlN and has a thickness on the uppermost surface 210C of the group III-N semiconductor material 210, that is less than or equal to 1 nm.

In an embodiment, the polarization charge inducing layer 214 is formed on the mobility enhancement layer 212. The polarization charge inducing layer 214 has sloped sidewalls. In an embodiment, polarization charge inducing layer 214 is formed using a metal organic chemical vapor deposition MOCVD process. In an embodiment, the polarization charge inducing layer 214 is grown by a MOCVD process at a temperature in the range of 1000-1100 degrees Celsius. In an embodiment, the MOCVD growth process leads to conformal growth of the polarization charge inducing layer 214 on the mobility enhancement layer 212. In an embodiment, the polarization charge inducing layer 214 includes a material such as but not limited to AlN, AlInN or $Al_yGa_{1-y}N$ (where y is 0.24-0.36) and the group III-N semiconductor material includes a material such as but not limited to InGaN or GaN. In an embodiment, the polarization charge inducing layer has a thickness that ranges from 3 nm-20 nm. In an embodiment, the polarization charge inducing layer 214 is AlInN. In an embodiment, the polarization charge inducing layer 214 is AlInN and has a thickness that ranges from 3 nm-10 nm. In an embodiment, the presence of a polarization charge inducing layer 214 induces strain in the group III-N semiconductor material. The strain is induced below the surface of mobility enhancement layer 212 and the group III-N semiconductor material 210. The presence of sufficient strain in the group III-N semiconductor material 210 induces 2 DEG (represented by dashed lines 217) in the strained region. In an embodiment, the group III-N semiconductor material 210, the mobility enhancement layer 212 and the polarization charge inducing layer 214 are sequentially grown in a single process introduction in an MOCVD growth chamber without breaking vacuum.

FIG. 2D illustrates the structure of FIG. 2C, following the etching of the material stack including the polarization charge inducing layer 214, the mobility enhancement layer 212 and the group III-N semiconductor material 210. In an embodiment, a mask is formed (not shown) on the polarization charge inducing layer 214. The mask covers the uppermost portion of the polarization charge inducing layer 214 and exposes sidewall portions of the polarization charge inducing layer 214 and the dielectric layer 204. In an embodiment, a plasma etch process is utilized to etch areas exposed by the mask. In an embodiment, the plasma etch process utilizes process gases such as but not limited to $SF_6$, $BCl_3$, $Cl_2$, $Br_2$ or Ar. In an embodiment, the polarization charge inducing layer 214 is AlInN, the mobility enhancement layer is AlN, the group III-N semiconductor material 210 is GaN and the isolation layer 204 is silicon dioxide. In one such embodiment, process gases utilizing a combination of $SF_6$, $BCl_3$, $Cl_2$, and Ar can be used to etch through the InAlN, AlN and GaN layers and etch stop on the silicon dioxide isolation layer 204. In an embodiment, due to the varying material compositions between the polarization charge inducing layer 214, the mobility enhancement layer 212 and the group III-N semiconductor material 210, the etch rates of these materials will vary. In one such embodiment, the plasma etch forms sidewalls in the polarization charge inducing layer 214, the mobility enhancement layer 212 and the group III-N semiconductor material 210, where the sidewalls of each layer has a different slope. In another embodiment, the sidewalls include step-like features in the polarization charge inducing layer 214, the mobility enhancement layer 212 and the group III-N semiconductor material 210. In an embodiment, subsequent to the completion of etch, the masking layer is removed.

FIG. 2E illustrates the structure of FIG. 2D, following the formation of isolation regions 216 adjacent to the patterned group III-N semiconductor material. In an embodiment, a polish stop layer 215 is blanket deposited on the uppermost surface and on sidewalls of the patterned polarization charge inducing layer 214, on sidewalls of the mobility enhancement layer 212 and on sidewalls of the group III-N semiconductor material 210 and on an uppermost surface of the isolation layer 204. In an embodiment, the polish stop layer is deposited using a PECVD process. In an embodiment, the polish stop layer 215 includes a dielectric material such as but not limited to silicon nitride, carbon doped silicon nitride or silicon oxynitride. In an embodiment, the polish stop layer has a thickness that is approximately in the range of 5 nm-10 nm. In one such embodiment, the sidewall portions of the polish stop layer have a thickness that is up to 70% of the thickness of the uppermost portion when the deposition is a PECVD deposition process.

A dielectric layer 216 is blanket deposited on the polish stop layer 215 and in the trench 213 and filling the trench 213. In an embodiment, the dielectric layer 216 is deposited using a PECVD deposition process. The as deposited thickness of the dielectric layer 216 will depend on the height of the group III-N semiconductor material. In an embodiment, the as deposited dielectric layer 216 has thickness that is approximately in the range of 200 nm-10 microns. Subsequent to the deposition process, the dielectric layer 216 layer is planarized. In an embodiment, a chemical mechanical planarization (CMP) process may be used to planarize the dielectric layer 216. In an embodiment, the planarization process removes the deposited dielectric layer 216 from the uppermost surface of the polish stop layer 215 and forms dielectric regions 216. In an embodiment, the CMP process results in the dielectric region 216 and the polish stop layer 215 having uppermost surfaces that are coplanar or substantially coplanar.

In an embodiment, a region 250 illustrates a material layer stack for co-fabrication of the transistor connected diode 101 and the group III-N transistor 151 as illustrated in FIG. 2E. The material layer stack includes the polish stop layer 215, the polarization charge inducing layer 214, the mobility enhancement layer 212, and the group III-N semiconductor material 210.

Figure 3L:
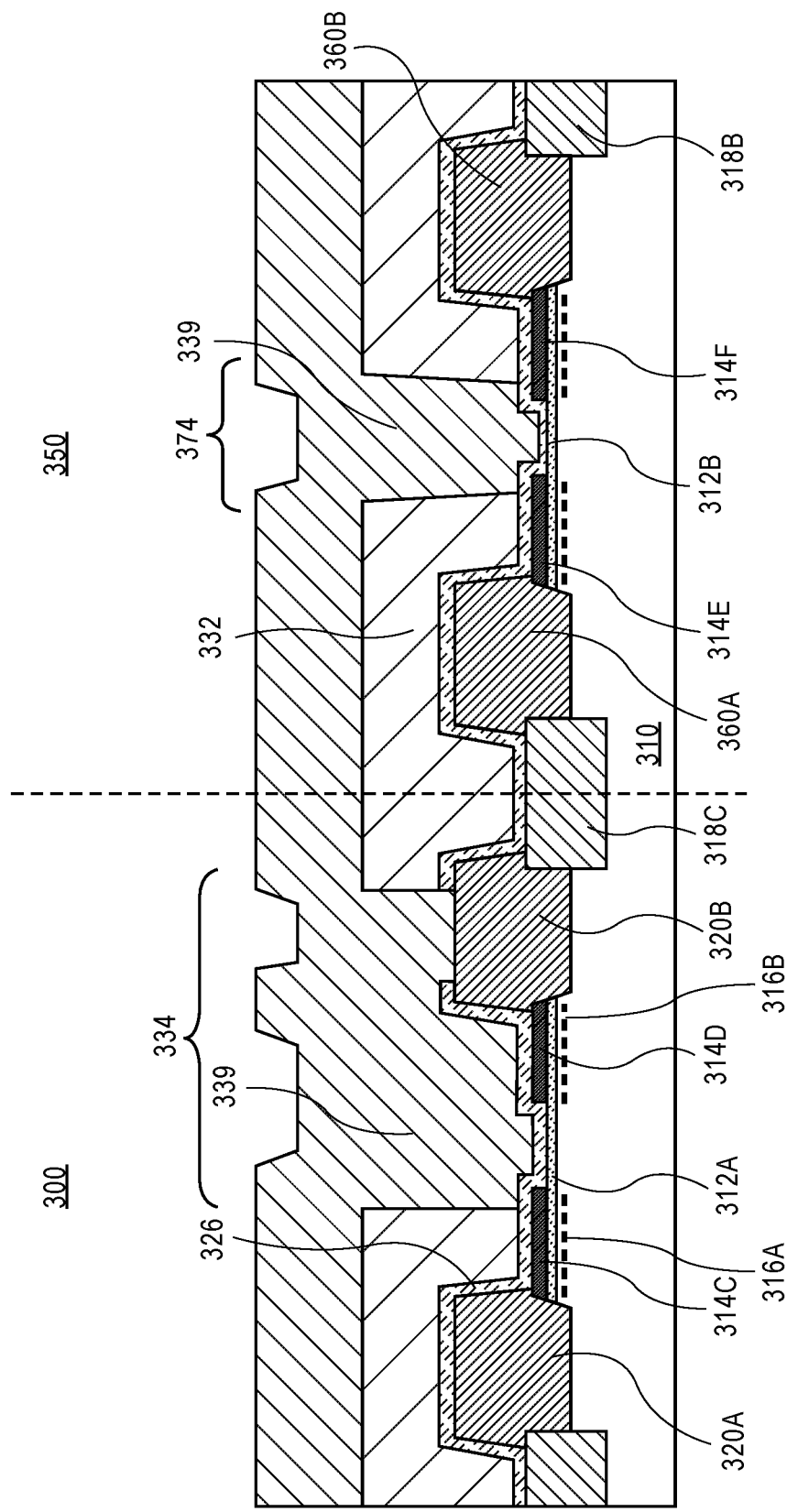
FIG. 3L illustrates the structure of FIG. 3K following the formation of a work function layer in the transistor connected diode region 300 and in the group III-N transistor region.
Figure 3M:
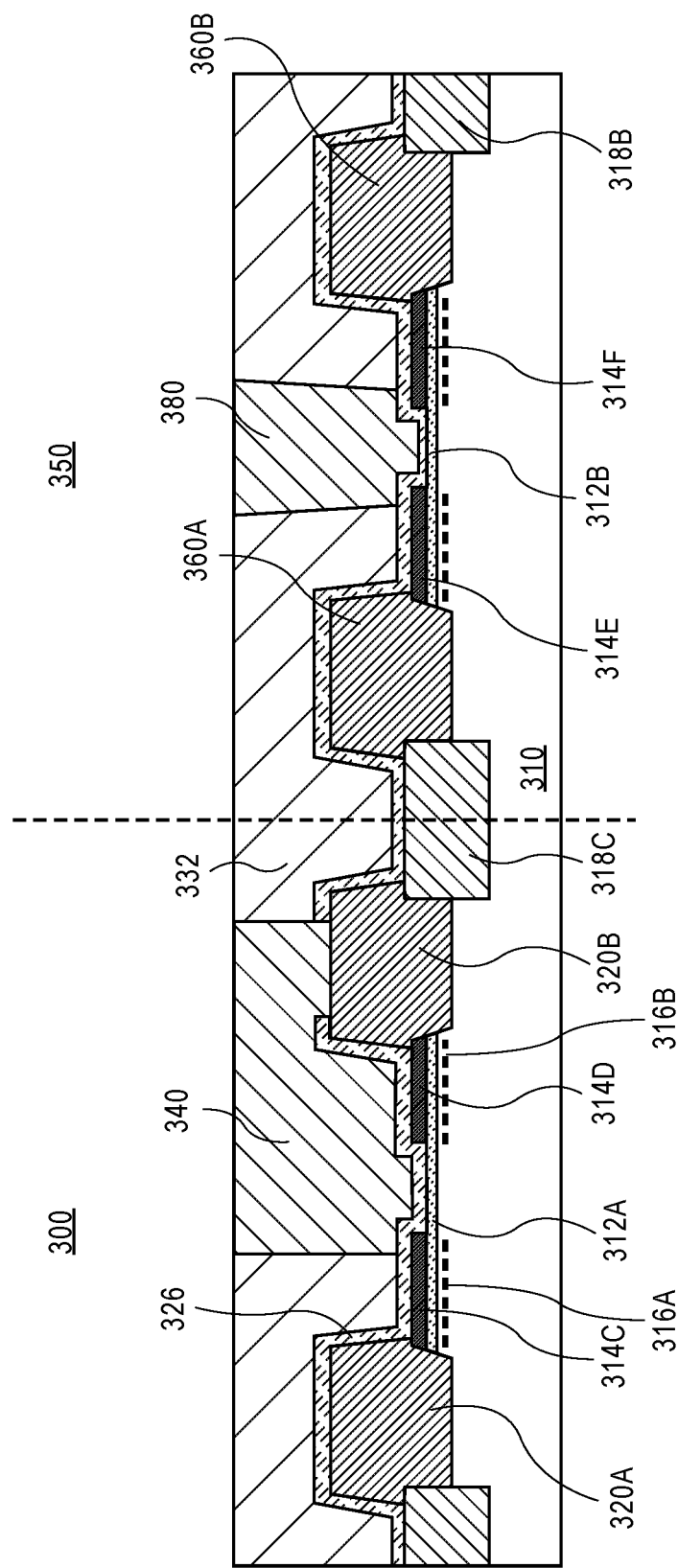
FIG. 3M illustrates the structure of FIG. 3L following the formation of a first electrode in the transistor connected diode region and the formation of a gate electrode in the group III-N transistor region.
Figure 3N:
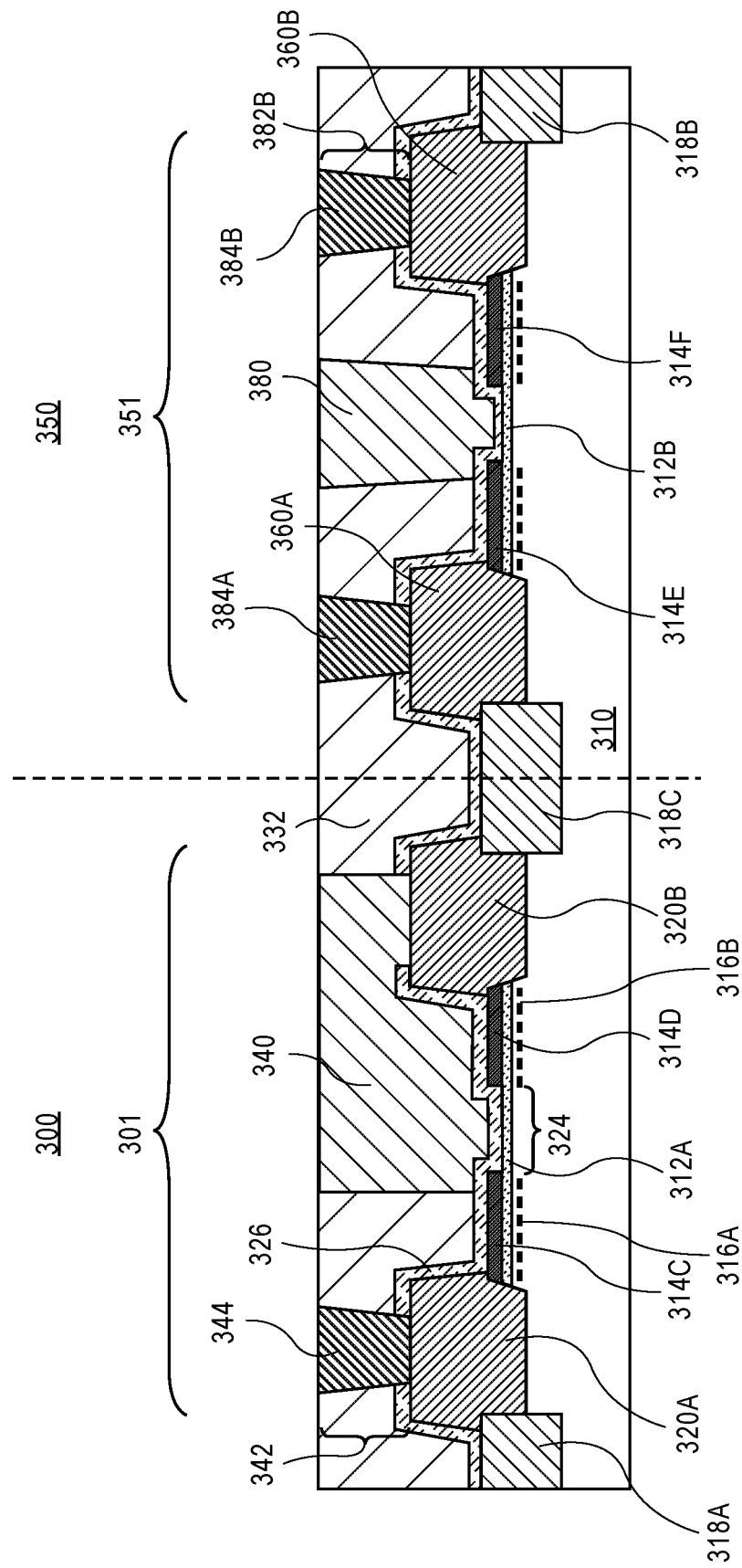

FIGS. 3A-3N illustrate cross-sectional views representing various operations in a method of fabricating a transistor connected diode 101 and/or a group III-N transistor 151 in a material layer stack such as is shown in region 250 of FIG. 2E.

FIG. 3A illustrates a transistor connected diode region 300 and a group III-N transistor region 350 sharing a common group III-N semiconductor material 310, a mobility enhancement layer 312, polarization charge inducing layer 314 and a polish stop layer 315. In an embodiment the material layers, thicknesses and methods to form polish stop layer 315, polarization charge inducing layer 314, mobility enhancement layer 312 and group III-N semiconductor material 310 are such as is described above for material layers, thicknesses and methods to form polish stop layer 215, the polarization charge inducing layer 214, the mobility enhancement layer 212 and the group III-N semiconductor material 210.

FIG. 3B illustrates the structure of FIG. 3A, following an etch process to form a plurality of isolation trenches 317A, 317B and 317C in the polish stop layer 315, the polarization charge inducing layer 314, the mobility enhancement layer 312 and the group III-N semiconductor material 310. In an embodiment, a trench mask (not shown) is formed on the polish stop layer 315. In an embodiment, the trench mask is formed from a resist material that is subsequently patterned to form features by a lithographic process. In an embodiment, the trench mask defines the locations and sizes of the isolation trenches to be formed. In an embodiment, a plasma etch process is utilized to etch areas exposed by the trench mask. In an embodiment, the polish stop layer 315 is etched by a first plasma etch process and the polarization charge inducing layer 314, the mobility enhancement layer 312 and the group III-N semiconductor material 310 are etched by a second etch process to form trenches 317A, 317B and 317C. The Trench 317A is formed in the transistor connected diode region 300, the trench 317B in the group III-N transistor region 350 and the trench 317C is formed partially in the transistor connected diode region 300 and partially in the group III-N transistor region 350. In an embodiment, the polarization charge inducing layer 314, the mobility enhancement layer 312 and the group III-N semiconductor material 310 is plasma etch with highly energetic ions and radicals (>0.5 eV ion energy) to form trenches 317A, 317B and 317C with vertical profiles. In other embodiments, the trenches 317A, 317B and 317C have tapered profiles.

Isolation trench 317C separates the polish stop layer 315 into a polish stop layer 315A and polish stop layer 315B, the polarization charge inducing layer 314A into a polarization charge inducing layer 314A and polarization charge inducing layer 314B and the mobility enhancement layer 312 into a mobility enhancement layer 312A and a mobility enhancement layer 312B. In an embodiment, each of the isolation trenches 317A, 317B and 317C have a depth that is approximately in the range of 100-150 nm as measured from an uppermost surface of the polish stop layer 315. In an embodiment, each of the isolation trenches 317A and 317B have a width that is approximately in the range of 100 nm-200 nm. In an embodiment, the trench 317A has a height and width chosen to sufficiently electrically isolate plurality of transistor connected diodes (to be subsequently formed) from each other in the transistor connected diode region 300. Similarly, in an embodiment, the trench 317B has a height and width chosen to sufficiently electrically isolate a plurality of group III-N transistors (to be subsequently formed) from each other in the group III-N transistor region 350. In an embodiment the trench 317C has a width that is approximately in the range of 100 nm-1 micron. The width of the trench 317C may be chosen to sufficiently electrically isolate a transistor connected diode from a group III-N transistor, to be subsequently fabricated in the transistor connected diode region 300 and group III-N transistor region 350, respectively.

FIG. 3C illustrates the structure of FIG. 3B, following the formation of a plurality of isolation regions 318A, 38B and 318C in the transistor connected diode region 300 and in the group III-N transistor region 350. In an embodiment, an isolation layer is blanket deposited in the trenches 317A, 317B and 317C and on the polish stop layer 315. In an embodiment, exemplary composition and methods of forming the isolation layer are such as is described above for dielectric layer 204. In an embodiment, the as deposited isolation layer has a thickness that is in the range of 200 nm-500 nm. In an embodiment, the isolation layer is subsequently planarized. In an embodiment, a chemical mechanical planarization (CMP) process may be used to planarize the isolation layer. In an embodiment, the CMP process removes the isolation layer from the uppermost surface of polish stop layer 315. In an embodiment, the polish process continues to polish and remove the polish stop layer from the uppermost surface of the polarization charge inducing layer 114. Additionally, in an embodiment, the CMP process leaves the isolation layer in each of the trenches 317A, 317B and 317C, forming isolation regions 318A, 318B and 318C respectively. The isolation region 318A is formed in the trench 317A in the transistor connected diode region 300. The isolation region 318B is formed in the trench 317B in the group III-N transistor region 350. In an embodiment, the planarization process results in isolation region 318A, isolation region 318B and isolation region 318C having uppermost surfaces that are coplanar or substantially coplanar with uppermost surface of the polarization charge inducing layer 314.

FIG. 3D illustrates the structure of FIG. 3C, following the formation of source-drain trenches in the polarization charge inducing layer, the mobility enhancement layer and the group III-N semiconductor material adjacent to the isolation structures in the transistor connected diode region 300 and the group III-N transistor region 350. In an embodiment, a trench mask with a plurality of openings is formed on the polarization charge inducing layer 314A and 314B. In an embodiment, the trench mask is composed of a resist layer which has been lithographically patterned to define the size, shape and location of the openings where the raised drain structures and the raised source structures are to be desired. The openings in the trench mask are formed adjacent to isolation region 318A and isolation region 318C in the transistor connected diode region 300. The openings in the trench mask are formed adjacent to isolation region 318C and isolation region 318B in the group III-N transistor region 350. In an embodiment, a plasma etch process is utilized to etch the polarization charge inducing layer 314, the mobility enhancement layer 312 and a portion of the group III-N semiconductor material 310. In one such embodiment, the polarization charge inducing layer 314, the mobility enhancement layer 312 and the group III-N semiconductor material 310 is plasma etched with highly energetic ions and radicals (>0.5 eV ion energy) to form trenches 319A, 319B, 359A, 359B with vertical profiles. In other embodiments, the 319A, 319B, 359A, 359B have tapered profiles. In an embodiment, top portions of isolation regions 318A, 318C and 318B can have rounded profiles due to ion bombardment effects during a high energy (>0.5 eV ion energy) plasma etching process (indicated by dashed lines 325).

In an embodiment, each of the trenches 319A, 319B, 359A and 359B have a height between 60-100 nm. In an embodiment, each of the trenches 319A, 319B, 359A and 359B have a width between 100-200 nm. In an embodiment, the trenches 317A and 317B have a height and width chosen to sufficiently enable epitaxial formation of raised source and raised drain structures with contact resistance values of less that 200 ohms-micron per side.

FIG. 3E illustrates the structure of FIG. 3D, following the formation of a first raised source structure 320A and a first raised drain structure 320B in the transistor connected diode region 300 and the formation of a second raised source structure 360A and a second raised drain structure 360B and structure in the group III-N transistor region 350. In an embodiment, the first raised source structure 320A, first raised drain structure 320B, the second raised source structure 360A and the second raised drain structure 360B are grown using a metal organic chemical vapor deposition MOCVD process. In an embodiment, the first and second raised source structures 320A and 360A and first and second raised drain structure 320B and 360B are grown by a MOCVD process at a temperature in the range of 1000-1100 degrees Celsius.

In an embodiment, the first raised source structure 320A and the first raised drain structure 320B, are epitaxially grown sufficiently thick to fill trenches 319A, 319B respectively. In an embodiment, the first raised source structure 320A grows laterally and extends onto a portion of the isolation region 318A and onto a portion of polarization charge inducing layer 314A. In an embodiment, the first raised drain structure 320B grows laterally and extends onto a portion of the isolation region 318C and onto a portion of polarization charge inducing layer 314A. In an embodiment, the second raised source structure 360A and the second raised drain structure 360B, are grown to fill trenches 359A, 359B respectively. In an embodiment, the second raised source structure 360A grows laterally and extends onto a portion of the isolation region 318C and onto a portion of polarization charge inducing layer 314B. In an embodiment, the second raised drain structure 360B grows laterally extends onto a portion of the isolation region 318B and onto a portion of polarization charge inducing layer 314B.

In an embodiment, the first raised source structure 320A, the first raised drain structure 320B, the second raised source structure 360A and the second raised drain structure 360B include a doped-group III-N semiconductor material such as but not limited to a doped GaN or InGaN. In one such embodiment, the doped group III-N semiconductor material is doped with an n-type dopant. In one such embodiment, the n-type dopant is a species such as Si, or Ge. In one embodiment, the n-type dopant is silicon. In an embodiment, the n-type dopant has a dopant density that is at least 1 e19/cm$^3$. In an embodiment, the first raised source structure 320A, the first raised drain structure 320B, the second raised source structure 360A and the second raised drain structure 360B are epitaxially grown to a thickness that is approximately in the range of 150-200 nm. In an embodiment, a combination of the height and width of the first and second raised source and raised drain structures, 320A, 360A, 320B and 360B respectively and the n-type dopant density are chosen to achieve a contact resistance that is less than 200 ohms-micron per side. In an embodiment, the second raised drain structure 360B and second raised source structure 360A have a contact resistance of 200 ohms-micron per side to realize a group III-N transistor 151 having a drive current of at least 1 mA/um.

FIG. 3F illustrates the structure of FIG. 3E, following the formation of a first opening 323 in a masking layer 322 formed in the transistor connected diode region 300 and the formation of a second opening 363 in the masking layer 322 formed in the group III-N transistor region 350. Openings 323 and 363 are designed to ultimately expose the underlying mobility enhancement layer 312A and 312B. In an embodiment, the masking layer 322 is a sacrificial light absorbing material. In an embodiment, the location, shape and size of the openings 323 and 363 are defined by lithographically patterning a resist layer (not shown) on the masking layer 322. In an embodiment, the masking material is a sacrificial light absorbing material and a plasma etch process is utilized to form the openings 323 and 363. In one such embodiment, the sacrificial light absorbing material has a substantially similar etch rate as the dielectric layer 204 when utilizing a plasma etch process. In an embodiment, the plasma etch includes gases such as but not limited to $SF_6$, $CF_4$, $CH_xF_y$, $O_2$ and Ar. In an embodiment, openings 323 and 363 are formed in the masking layer 322 and expose the polarization charge inducing layer 314A and 314B, respectively. In one such embodiment, the masking layer 322 can be etched selectively to the underlying polarization charge inducing layer 314A and 314B with an etch selectivity that is greater than 10:1.

In an embodiment, the masking layer 322 is plasma etched with highly energetic ions and radicals (>0.3 eV ion energy) to form vertical openings 323 and 363 as illustrated in FIG. 3F. In other embodiments, the openings 323 and 363 are etched to have tapered profiles. In one such embodiment, a tapering etch causes the width, at the bottom of the opening, $W_B$ to narrower than the drawn dimension of the top of the opening. A tapering etch to scale the gate length $L_G$, of the group III-N transistor to be ultimately fabricated in the group III-N transistor region 350.

In an embodiment, each of the openings 323 and 363 have a width, at the bottom of the opening, $W_B$, that is approximately in the range of 50 nm-500 nm. In an embodiment, the resist layer defines openings 323 and 363 that are approximately equal in size. An exemplary embodiment, where one of the openings 323 or 363 is wider than the other will be discussed in association with FIG. 4.

FIG. 3G illustrates the structure of FIG. 3F, following the formation of a first gap 324 and a second gap 364 in the polarization charge inducing layer 314A and 314B, respectively. In an embodiment, the first gap 324 and second gap 364 are created by removing portions of the polarization charge inducing layer 314A and 314B exposed by openings 323 and 363, respectively. In an embodiment, the portions of the polarization charge inducing layer 314A and 314B exposed by openings 323 and 363, respectively, are removed by a plasma etch process to form the first gap 324 and second 364 respectively. In an embodiment, the first gap 324 and the second gap 364 expose the underlying mobility enhancement layer 312A and 312B, respectively. In an embodiment, the polarization charge inducing layer 314A and 314B include a material such InAlN or AlGaN and the underlying mobility enhancement layer 312A and 312B is AlN. In one such embodiment, portions of the polarization charge inducing layers 314A and 314B are removed by plasma etch process with process gases that include but are limited to $BCl_3$, $Cl_2$, Ar and $N_2$. In one such specific embodiment, the plasma etch process includes a main etch portion and a cleanup portion. The main etch portion removes approximately 80-90% of the thickness of the polarization charge inducing layers 314A and 314B from the openings 323 and 363 respectively. In an embodiment, the cleanup portion, removes the remaining polarization charge inducing layer 314A and 314B selectively to the underlying mobility enhancement layers 312A and 312B, respectively. In an embodiment, the cleanup portion has an etch rate which removes the polarization charge inducing layer 314A and 314B at least 20 times faster than the underlying mobility enhancement layer 312A and 312B, respectively. Such a differential etch rate enables the underlying mobility enhancement layer 312A and 312B to be preserved while the polarization charge inducing layer 314A and 314B is removed to form the first gap 324 and the second gap 364. Preserving the mobility enhancement layers 312A and 312B is essential for ensuring electron confinement in the underlying group III-N semiconductor material 310.

In an embodiment, the gap 324 formed by the plasma etch process separates the polarization charge inducing layer 314A into a first portion 314C and a second portion 314D in the transistor connected diode region 300. Furthermore, the absence of the polarization charge inducing layer 314A in the first gap 324 leads to depletion of 2 DEG from underneath the first gap 324. Similarly, in an embodiment, the second gap 364 formed by the plasma etch process separates the polarization charge inducing layer 314B into a third portion 314E and a fourth portion 314F in the group III-N transistor region 350. Furthermore, the absence of the polarization charge inducing layer 314B in the first gap 324 leads to depletion of 2 DEG from underneath the first gap 324.

In an embodiment, each of the first gap 324 and the second gap 364 have a width, $W_B$, that ranges from 30 nm-500 nm. In particular, the width, $W_B$, of the second gap 364 in the group III-N transistor region 350, defines an important transistor parameter known as the gate length or $L_G$. In an embodiment, the second gap 364 is formed midway between the second raised drain structure 360B and the second raised source structure 360A. In other embodiments, the second gap 364 is formed closer to the second raised source structure 360A than to the second raised drain structure 360B.

In an embodiment, a small portion of the polarization charge inducing layer 314A and 314B in the first gap 324 and second gap 364, respectively, is not removed by the plasma etching process. In one such embodiment, the underlying mobility enhancement layer 312A and 312B are not exposed by the first gap 324 and by the second gap 364, respectively. In one such embodiment, each of the remaining portions of the polarization charge inducing layers 314A and 314B in the first and second gaps 324 and 364, respectively, have a thickness that is less than the thickness needed to induce 2 DEG in the group III-N semiconductor material 310 under the first and second gaps 324 and 364, respectively. Depending on the plasma etch process parameters, the etch may (a) leave a uniformly thin layer of the polarization charge inducing layer 314A and 314B or (b) create a bowl-shaped profile in the polarization charge inducing layer 314A and 314B.

FIG. 3H illustrates the structure of FIG. 3G, following the removal of the masking layer 322 from the transistor connected diode region 300 and from the group III-N transistor region 350. In an embodiment, the masking layer 322 is a sacrificial light absorbing material. In one such embodiment, a wet chemical solution (wet etch process) including hydrogen fluoride and water removes the sacrificial light absorbing material.

FIG. 3I illustrates the structure of FIG. 3H, following the deposition of a gate dielectric layer in the transistor connected diode region 300 and in the group III-N transistor region 350. In an embodiment, the gate dielectric layer 326 is blanket deposited on the exposed portions of the mobility enhancement layer 312A and 312B opened in the first gap 324 and in the second gap 364, respectively. Suitable materials for the forming a gate dielectric layer 326 include dielectric materials such as but not limited to $Al_2O_3$, $HfO_2$, $ZrO_2$, TiSiO, HfSiO or $Si_3N_4$. In an embodiment, the gate dielectric layer 326, is formed by an atomic layer deposition (ALD) process. In an embodiment, the gate dielectric layer 326 has a thickness approximately in the range of 2 nm-10 nm.

FIG. 3J illustrates the structure of FIG. 3I, following the removal of the gate dielectric layer 326 in the transistor connected diode region 300 to expose a portion of an uppermost surface of the first raised drain structure 320B. Exposure of a portion of the first raised drain structure 320B ensures that a first metal electrode to be deposited in a subsequent operation is physically in contact (to provide robust electrical connection) with the first raised drain structure 320B. In an embodiment, the process of removing the gate dielectric layer 326 includes (a) forming a sacrificial layer 328 (b) etching an opening in the sacrificial layer 328 and (c) subsequently etching the exposed gate dielectric layer 326. In an embodiment, the sacrificial layer 328 is a sacrificial light absorbing material. In an embodiment, the sacrificial material is a sacrificial light absorbing material and a plasma etch process is utilized to form the opening 330. In an embodiment, the plasma etch process has two portions. A first etch portion etches the sacrificial material 328 and etch stops on the gate dielectric layer 326. A subsequent second etch portion, removes the exposed portion of the gate dielectric layer 326. The second etch process exposes an uppermost surface of the first raised drain structure 320B. In an embodiment, while etching the gate dielectric layer 326, a portion of the of the first raised drain structure 320B under the opening 330 (as indicated by dashed lines 327) may be recessed.

FIG. 3K illustrates the formation of an electrode opening 334 in a dielectric layer 332 formed in the transistor connected diode region 300 and a gate opening 374 in the dielectric layer 332 formed in a group III-N transistor region 350. In an embodiment, the dielectric layer 332 is blanket deposited on the gate dielectric layer 326 and on the exposed portion of the first raised drain structure 320B. Exemplary layer composition and method of forming the dielectric layer 332 may be as is described above for layer composition and method of forming the isolation layer 204. In an embodiment, the as deposited dielectric layer 332 has a thickness that is approximately in the range of 500 nm-700 nm. In an embodiment, the dielectric layer 332 is subsequently planarized. In an embodiment, the dielectric layer 332 is planarized by a CMP process. In an embodiment, a trench mask is formed (not shown) on the surface of the planarized dielectric layer 332. In an embodiment, the trench mask includes a resist layer that is lithographically patterned to define locations and sizes for electrode opening 334 and gate opening 374. In an embodiment, the dielectric layer 332 is plasma etched through the trench mask to form the electrode opening 334 and gate opening 374. In an embodiment, the plasma etch process utilizes process gases such as but not limited to $CF_X$, $CH_XF_Y$, CO, $O_2$, $N_2$ or Ar to etch the dielectric layer 332. In an embodiment, the dielectric layer 332 is a silicon dioxide and the first raised drain structure 320B is n-doped InGaN. In one such embodiment, a plasma etch which includes process gases such as but not limited to $CH_XF_Y$, CO, $O_2$ and Ar can be used to etch the silicon dioxide dielectric layer 332 selectively to the underlying gate dielectric layer 326 and the n-doped InGaN-first raised drain structure 320B.

FIG. 3L illustrates the structure of FIG. 3K following the formation of a work function layer 339 in the transistor connected diode region 300 and in the group III-N transistor region 350. The work function layer 339 partially determines the threshold, or turn on, voltage of a group III-N transistor. In an embodiment, a work function layer 339 is deposited in and completely filling the electrode opening 334 and gate opening 374 by a blanket deposition process. The work function layer 339 is also deposited on the uppermost surface of the dielectric layer 332. The work function layer 339 is formed on the gate dielectric layer 326 in the opening 334 and on the exposed uppermost surface of the first raised drain structure 320B in the transistor connected diode region 300. The work function layer 339 is also formed on the dielectric layer 326 in the gate opening 374 in the group III-N transistor region 350. In an embodiment, the work function layer 339 is deposited by a blanket physical vapor deposition (PVD) or an atomic layer deposition (ALD) process. In an embodiment, the work function layer 339 includes a metal such as but not limited to Pt, Ni, Ti, Ta or a conductive alloy such as TiN or TaN. In an embodiment, the work function layer 339 is capped by a metal such as tungsten. In an embodiment, tungsten is deposited by a CVD process.

FIG. 3M illustrates the structure of FIG. 3L following the formation of a first electrode 340 in the transistor connected diode region 300 and the formation of a gate electrode 380 in the group III-N transistor region 350. The work function layer 339 in the structure of FIG. 3L is subsequently planarized to form the first metal electrode 340 and gate electrode 380. In an embodiment, the planarization process includes a CMP process. In an embodiment, the CMP process removes all of the work function layer 339 from the uppermost surface of the dielectric layer 332 and leaves the work function layer 339 in the electrode opening 334 and gate opening 374. Uppermost surfaces of the dielectric layer 332, the first metal electrode 340 and the gate electrode 380 are co-planar or substantially co-planar after the CMP process.

FIG. 3N illustrates the structure of FIG. 3M following the formation of a second metal electrode 344 in the transistor connected diode region 300, and the formation of a source contact 384A and a drain contact 384B in the group III-N transistor region 350. In an embodiment, a resist layer is formed and lithographically patterned over the dielectric layer 332, the gate electrode 380 and the first metal electrode 340. The pattered resist layer defines desired locations in the dielectric layer 332 where the second metal electrode 344 and the source contact 384A and the drain contact 384B are to be formed. In an embodiment, portions of the dielectric layer 332 exposed by the patterned resist layer are etched by a plasma etch process to partially form openings 342, 382A and 382B. In a subsequent operation, the openings 342, 382A and 382B are completely formed after the plasma etch process continues to remove portions of the gate dielectric layer 326 exposed during etching of the dielectric layer 332. The openings 342, 382A and 382B expose an uppermost surface of the first raised source structure 320A, an uppermost surface of the second raised drain structure 360B and an uppermost surface of the second raised source structure 360A, respectively.

In an embodiment, one or more layers of contact metal are deposited inside each of the openings 342, 382A and 382B, and on the uppermost layer of the dielectric layer 332, the uppermost surface of the first metal electrode 340 and on the uppermost surface of the gate electrode 380. In an embodiment, the one or more layers of contact metal is deposited using a PECVD or an ALD process. In an embodiment, suitable contact metals include metals such as but not limited to Ti, Al or Ni. In an embodiment, a tungsten capping layer is deposited on the one or more layers of contact metal. In an embodiment, where the tungsten capping layer is deposited on the one or more layers of contact metal, the one or more layers of contact metal is first deposited on the bottom and on the sides of the opening 342, 382A and 382B and the tungsten capping layer is deposited to fill the remaining portion of the openings 342, 382A and 382B. In an embodiment, the one or more layers of contact metal is deposited to a thickness in the range of 10-30 nm, and the tungsten capping layer is deposited to fill the remaining portion of each of the openings 342, 382A and 382B.

Referring again to FIG. 3N, a planarization process is carried out to remove the one or more layers of contact metal from the uppermost surface of the dielectric layer 332. In one embodiment, the planarization process includes a chemical mechanical polish (CMP) process. The CMP process removes all the one or more layers of contact metal from the uppermost surfaces of the dielectric layer 332, from the uppermost surface of the first metal electrode 340 and from the uppermost surface of the gate electrode 380. The CMP process leaves the one or more layers of contact metal in the openings 342, 382A and 382B to form a second metal electrode 344 in the transistor connected diode region 300, a raised source contact 384A and a raised drain contact 384B in the group III-N transistor region 350.

In an embodiment, the transistor connected diode 301 and the group III-N transistor 351 of FIG. 3N undergoes an annealing process to improve transistor characteristics of a group III-N transistor such as increase breakdown voltage and reduce gate current leakage. In an embodiment, the annealing process involves heating the substrate at a process temperature that is approximately in the range of 300-400 degrees Celsius. In an embodiment, the annealing process is carried out by subjecting the substrate to chuck heating in the presence of a $H_2/N_2$ gas flow. In an embodiment, the annealing process also diffuses the nitrogen from the surface of the first raised source structure 320A, the second raised source structure 360A and the second raised drain structure 360B into the contact metals.

Figure 4A:
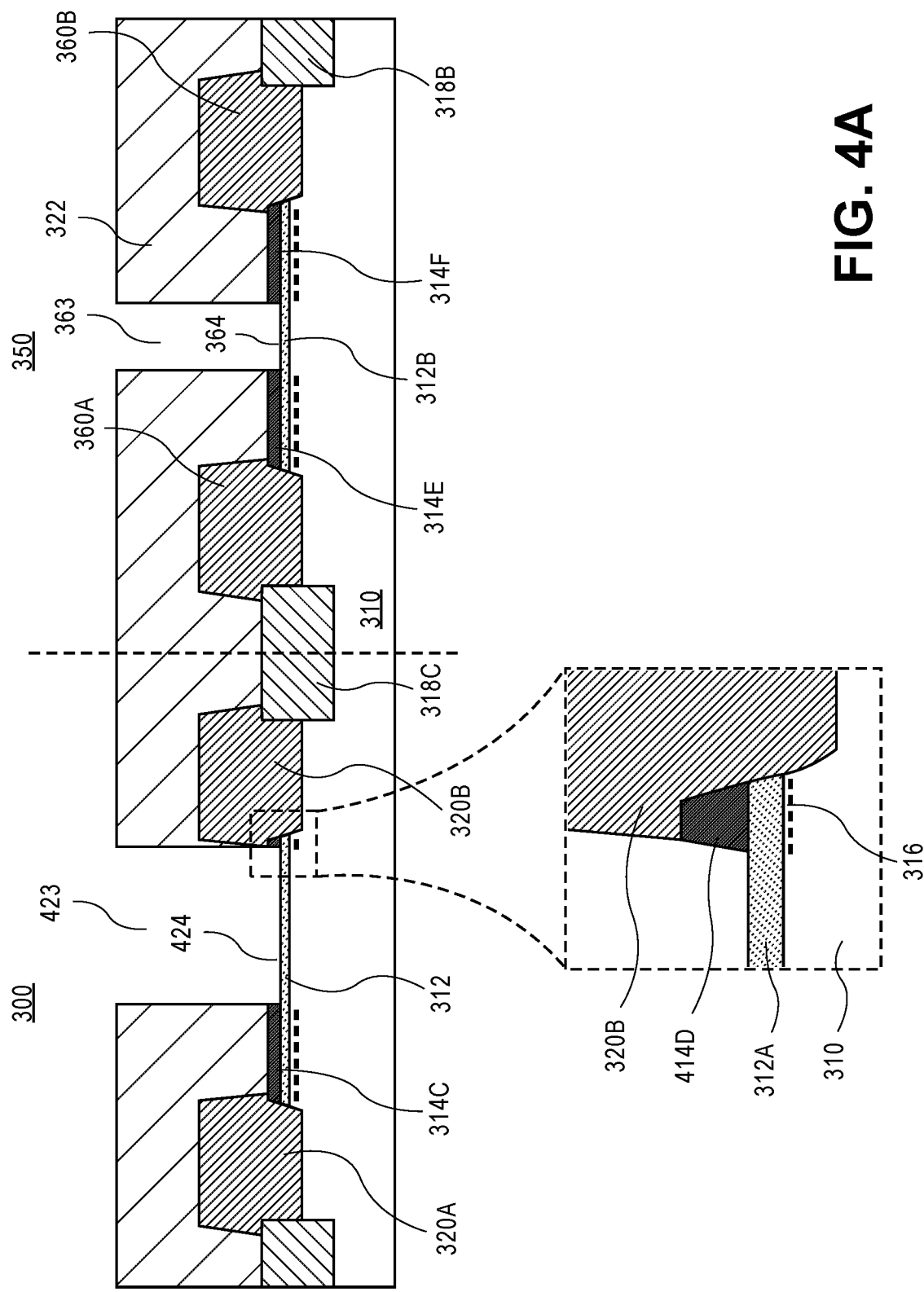
FIG. 4A illustrates an embodiment of the structure of FIG. 3J, following the removal of the gate dielectric layer in the transistor connected diode region to expose a portion of an uppermost surface of the first raised drain structure and the second portion of the polarization charge inducing layer.

FIG. 4A illustrates an embodiment of the structure of FIG. 3G, where the first gap 324 extends to approximately the location of the first raised drain structure 320B while the width $W_B$ of the second gap 364 remains unchanged. In an embodiment, an opening 423 is formed in the masking layer 322 by a plasma etch process. The opening 423 exposes a portion of the polarization charge inducing layer 314. Subsequently, the portion of polarization charge inducing layer 314A, exposed by the opening 423 is removed by a second plasma etch process to expose the mobility enhancement layer 312A. Removal of the portion of the polarization charge inducing layer 312A by the second plasma etch creates a first gap 424 above the mobility enhancement layer 312A. In an embodiment, the first gap 424 exposes approximately 50-60% of the mobility enhancement layer 312. In an embodiment, after formation of the gap 424, a second portion 414D of the polarization charge inducing layer 314A remains adjacent to the first raised drain structure 320B as illustrated in the enhanced cross sectional illustration of FIG. 4A. In an embodiment, the second portion 414D of the polarization charge inducing layer 314A has a width that ranges from 5 nm-20 nm. In an embodiment, the polarization charge inducing layer 314A is plasma etched by highly energetic ions and radicals (>5 eV ion energy) to form second portion 314D of the polarization charge inducing layer 314A having a sidewall with a vertical profile. In other embodiments, the second portion 414D of the polarization charge inducing layer 314A has a flared sidewall profile, as is illustrated in the enhanced cross-sectional illustration. It is to be appreciated that a 2 DEG is present under the second portion 414D of the polarization charge inducing layer 314A. In one such embodiment, the 2 DEG under the second portion 414D of the polarization charge inducing layer 314A has a lateral extent that is much less than the 2 DEG present under the first portion 314C of the polarization charge inducing layer 314A. In other embodiments, not shown, the second portion of the polarization charge inducing layer 414D is completely etched leaving a void under the first raised drain structure 320B.

FIG. 4B illustrates the structure of 4A, following the blanket deposition of a gate dielectric layer 326 in the transistor connected diode region 300 and in the group III-N transistor region 350. In an embodiment, exemplary material composition and methods of forming gate dielectric layer 326 is such as is described above for material composition and methods of forming gate dielectric layer 326.

FIG. 4C illustrates the structure of 4B, following a sequence of process operations to form a transistor connected diode 401 and a group III-N transistor 351. In an embodiment, the series of process operations carried out to form transistor connected diode 401 is similar to the series of process operations carried out to form transistor connected diode 301 in associated with FIGS. 3J-3N. As compared to transistor connected diode 301, transistor connected diode 401 may offer area scaling advantages. By reducing the width of the first gap 424, and making it comparable to the width of the gap 324 for transistor connected diode 301 more transistor connected diodes such as transistor connected diode 401 with a reduced first gap can be fabricated in a given area.

Figure 5A:
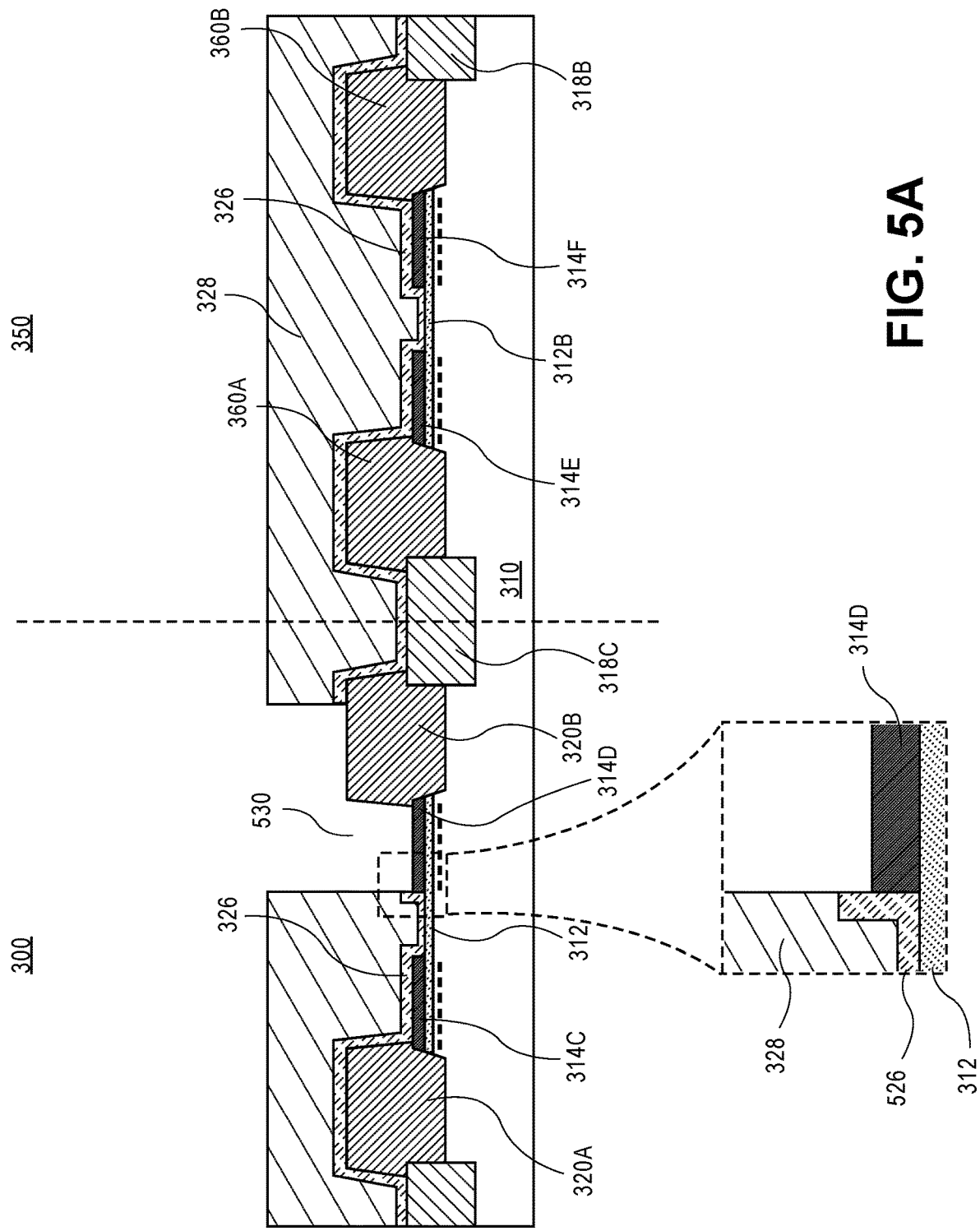
FIG. 5A illustrates an embodiment of the structure of FIG. 3J, following the removal of the gate dielectric layer in the transistor connected diode region to expose a portion of an uppermost surface of the first raised drain structure and the second portion of the polarization charge inducing layer.

FIG. 5A illustrates an embodiment of the structure of FIG. 3J, following the removal of the gate dielectric layer 326 from the uppermost surface and from sidewalls of the first raised drain structure 320B and from the second portion 314D of the polarization charge inducing layer 314A. In one such embodiment, the opening 530 is formed by plasma etch process that is similar to the plasma etch process used to form the opening 330 in FIG. 3J. In an embodiment, the plasma etch process has two portions. A first etch portion etches the sacrificial material 328 and etch stops on the gate dielectric layer 326. A subsequent second etch portion, removes the exposed portion of the gate dielectric layer 326 from the uppermost surface and from sidewalls of the first raised drain structure 320B and from the second portion 314D of the polarization charge inducing layer 314A as illustrated in FIG. 5A. In an embodiment, while etching the gate dielectric layer 326, a corner portion (indicated by dashed lines 527) of the first raised drain structure 320B can be eroded.

Figure 5B:
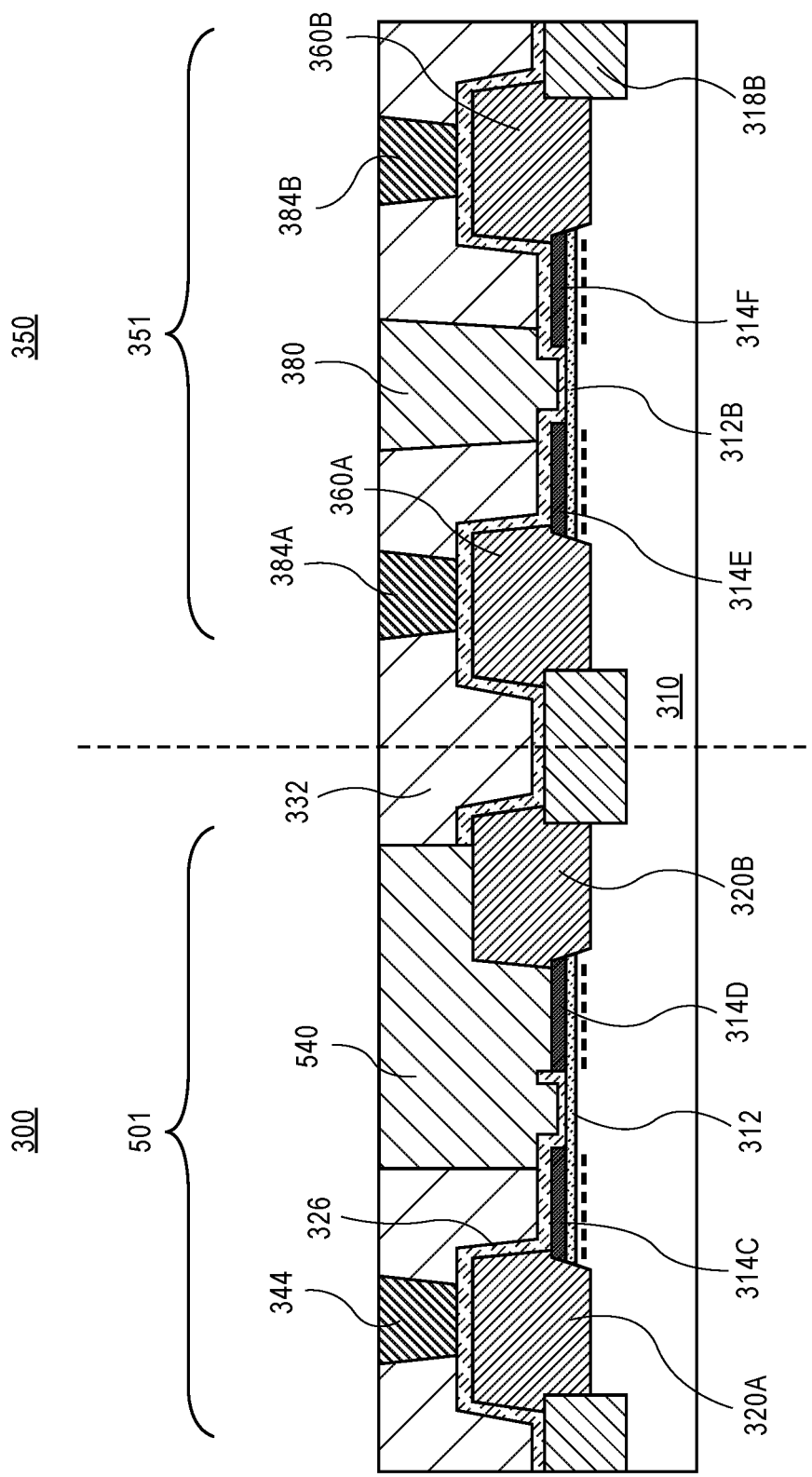
FIG. 5B illustrates the structure of 5A, following a sequence of process operations to form a transistor connected diode and a group III-N transistor.

FIG. 5B illustrates the structure of 5A, following a sequence of process operations to form a transistor connected diode 501 and a group III-N transistor 351. In an embodiment, a series of process operations similar to the process operations associated with FIGS. 3K-3N is carried out to form a transistor connected diode 501 in transistor connected diode region 300 and a group III-N transistor 351 in a group III-N transistor region 350. In an embodiment, the gate electrode 540 has a portion that is disposed directly on the second portion 314D of the polarization charge inducing layer 314A and a portion that is disposed directly on the sidewalls of the first raised drain structure 320B as illustrated in FIG. 5B. In an embodiment, gate electrode 540 has a larger portion of the gate electrode that is in contact with the uppermost surface of the first raised drain structure 320B as compared to gate electrode 340 from the structure of FIG. 3N.

As compared to transistor connected diode 301, transistor connected diode 501 may offer contact resistance advantage. In particular, in an embodiment, the gate dielectric layer 326 is etched from the sidewall of the first raised drain structure 320B. The larger surface area provides an increased amount of contact surface area with the first metal electrode 540. In an embodiment, an increased surface area can reduce the overall raised drain structure contact resistance (200 ohms-micron per side.) by at least 20%.

Figure 6B:
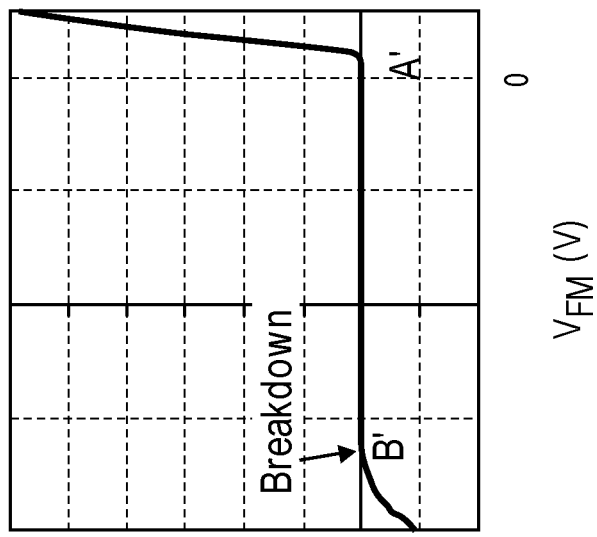
FIG. 6B illustrates a current vs gate voltage plot showing the breakdown characteristics of the transistor connected diode.
Figure 6A:
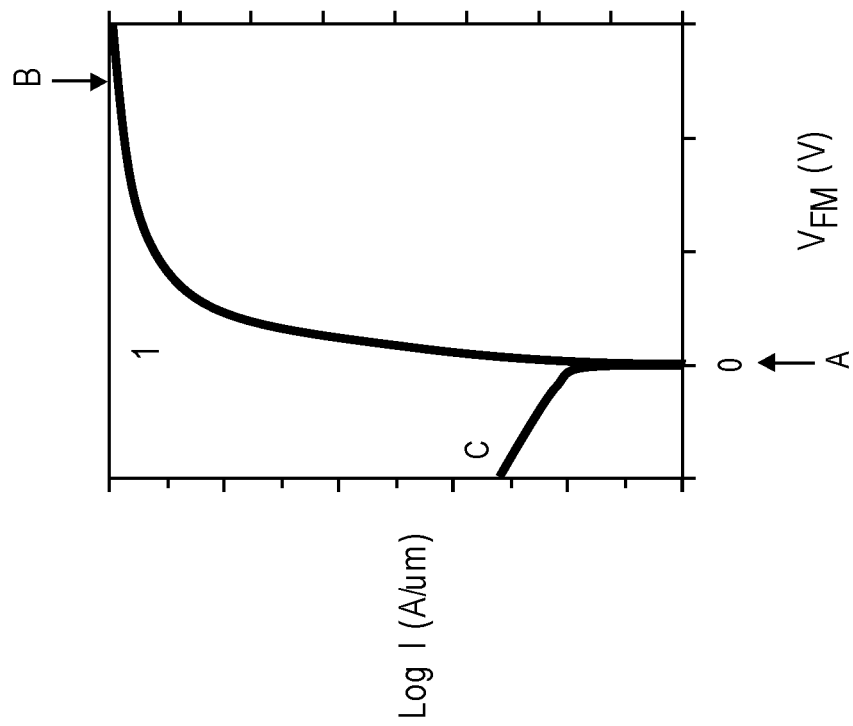
FIG. 6A illustrates a current vs gate voltage plot for the transistor connected diode of FIG. 3K.

FIG. 6A illustrate a current vs voltage plot for a forward biased transistor connected diode 301 of FIG. 3N. The voltage applied on the first metal electrode, VM is plotted on the horizontal axis and log of the current through the transistor connected diode 301 is plotted on the vertical axis. The current is plotted on a log scale to enhance understanding of the characteristics of the transistor connected diode 301. When the first metal electrode 340 is biased positively relative to the second metal electrode 344, a channel is formed in the group III-N semiconductor material 310 below the first gap 324. The formation of a channel leads to almost current flow through the transistor connected diode 301. This is indicated by sweeping the voltage from points A to point B. FIG. 6A illustrates a very sharp rise in the current, Log I, with very little change in the applied first electrode voltage, $V_{FM}$ (for e.g. between 0V-0.5V).

In an embodiment, when the first metal electrode 340 is biased negatively with respect to the second metal electrode 344 and the voltage is increased from 0V to −1V (from point A to point C), there is a small but finite amount of conduction current. In an embodiment, the I-V plot shows that there is finite leakage current in the transistor connected diode 301 when the first metal electrode 340 is biased negatively relative to the second metal electrode 344. The leakage current is 1/10 of the value of the peak current through the diode 301.

FIG. 6B illustrates a current vs gate voltage plot showing the breakdown characteristics of the transistor connected diode 301. The voltage applied on the first metal electrode 340 is plotted on the horizontal axis and the current through the transistor connected diode 301 is plotted on the vertical axis. The current is plotted on a linear scale to enhance understanding of the breakdown characteristics of the transistor connected diode 301. When the first metal electrode 340 is negatively biased, the electrons are repelled under the first gap 324 creating an open circuit. In an embodiment, when the first metal electrode 340 is biased negatively and the voltage is increased from 0V to negative 15V (from point A' to point B') there is a small but finite amount of conduction current (as evident from FIG. 6A). A linear plot does not provide enough enhancement to highlight the conduction current levels. However, upon application of a bias voltage known as breakdown voltage or $V_{BD}$, there is sudden current conduction in the transistor connected diode 301. In an embodiment, the transistor connected diode 301 has breakdown voltage or $V_{BD}$, that is approximately negative 17V. In one such embodiment, a voltage of approximately negative 17V will conduct current in the reverse direction in the transistor connected diode 301 (i.e. from raised source structure 320A to first metal electrode 340).

Figure 7:
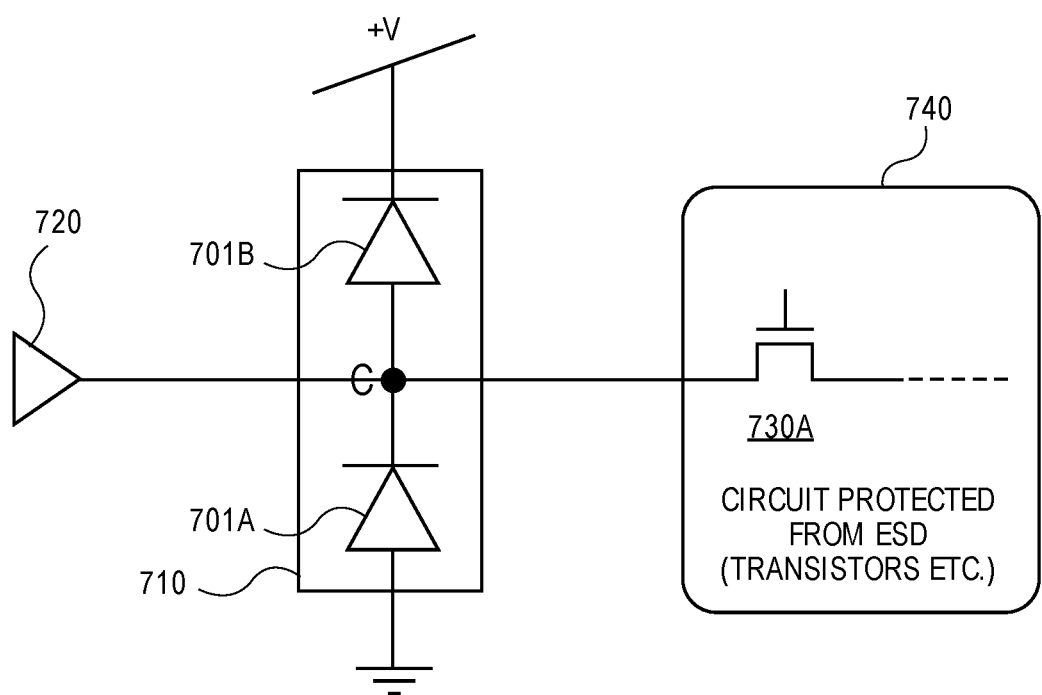
FIG. 7 illustrates a circuit layout demonstrating transistor connected diodes connected between an ESD source circuit elements including transistors (or an array of transistor) that require ESD protection.

FIG. 7 illustrates a circuit layout demonstrating PN diodes connected between an ESD source and circuit elements including transistors (or an array of transistor) that require ESD protection. In an embodiment, diodes 701A and 701B are connected in series as part of an ESD protection circuit 710. An anode of diode 701A is connected to ground and a cathode of diode 701B is connected to the positive rail (battery). A location for an ESD source 720, is connected to the cathode of diode 701A and anode of diode 701B (point C). In an embodiment, the location for an ESD source 720 is an antenna connected to the ESD protection circuit 710. The point C on the circuit 710 is also connected to a circuit element 740 that houses the circuit 730 needing protection from ESD events. The circuit element 740 may include semiconductor devices such as transistors in a circuit 730 or transistors and capacitors in a circuit 730. Diodes 701A and 701B provide low resistance current paths compared to the circuit element 740 and can conduct current very rapidly as evident from the I-V plot in FIG. 6A. Diode 701B is forward biased and diode 701A is reverse biased. During an ESD event, high current can flow in two directions. If an ESD event delivers a voltage with a positive polarity, diode 701B will provide a gateway for the charge to flow through to the battery terminals (+V). If the ESD event delivers a voltage with a negative polarity that is greater than a critical breakdown voltage, then high current can flow from diode 701A to ground (as illustrated in FIG. 6B). Because diodes 701A and 701B provide low resistance paths when operational, depending on the voltage polarity, diodes 701A and 701B will divert the high current away from the circuit element 740, thus providing the internal components such as transistor 730 protection from an ESD event. In an embodiment, the circuit element 740 includes multiple transistors that are connected together to form functional circuits such as a power amplifier. In one such embodiment, the drain contact of a transistor in circuit element 730, is connected to point C on the diode circuit 710. In an ESD event, since the diode 701B provides a current path of less resistance as compared to the drain contact of transistor in circuit element 730, current will flow through the diode 701B, offering protection to the transistors. In an embodiment, diodes 701A and 701B include PN diodes such as PN diode 301 in accordance with an embodiment of the present invention. In an embodiment, the transistors in the circuit element 730 include a plurality of group III-N transistors such as group III-N transistors 351 in accordance with an embodiment of the present invention.

Figure 8:
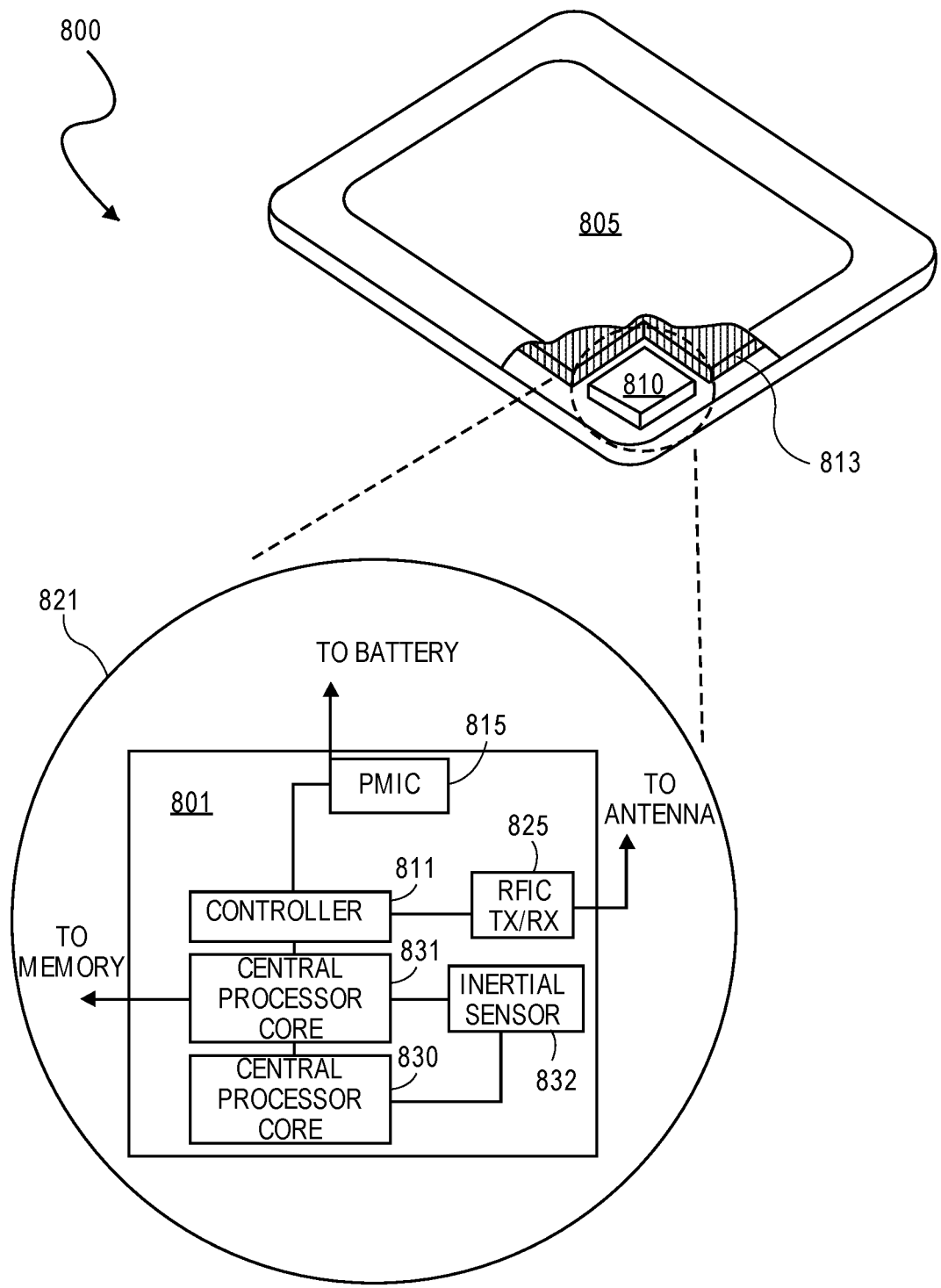
FIG. 8 is a functional block diagram of a group III-N SoC implementation of a mobile computing platform, in accordance with an embodiment of the present invention.

FIG. 8 is a functional block diagram of a group III-N SoC (system on chip) implementation of a mobile computing platform, in accordance with an embodiment of the present invention. The mobile computing platform 800 may be any portable device configured for each of electronic data display, electronic data processing, and wireless electronic data transmission. For example, mobile computing platform 800 may be any of a tablet, a smart phone, laptop computer, etc. And includes a display screen 805 that is in the exemplary embodiment a touchscreen (e.g., capacitive, inductive, resistive, etc.) permitting the receipt of user input, the SoC 810, and a battery 813. As illustrated, the greater the level of integration of the SoC 810, the more of the form factor within the mobile computing platform 800 that may be occupied by the battery 813 for longest operative lifetimes between charging, or occupied by memory (not depicted), such as a solid state drive, for greatest functionality.

Depending on its applications, mobile computing platform 800 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 810 is further illustrated in the expanded view 821. Depending on the embodiment, the SoC 810 includes a portion of a substrate 801 (i.e., a chip) upon which two or more of a power management integrated circuit (PMIC) 815, RF integrated circuit (RFIC) 825 including an RF transmitter and/or receiver, a controller 811 thereof, and one or more central processor core 830, 831 and inertial sensor 832 is fabricated. The RFIC 825 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 825 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 815 and RFIC 825. In embodiments of the present invention, the PMIC 815 and RFIC 825 employ one or more of the transistor connected diodes and group III-N transistors as described herein (e.g., group III-nitride transistor 151). In an embodiment, each transistor connected diode 101 includes group III-N semiconductor material 110 such as GaN with a polarization charge inducing layer 114 including InGaN. In further embodiments the PMIC 815 and RFIC 825 employing the transistor connected diodes and group III-nitride transistors described herein are integrated with one or more of the controller 811 and central processor cores 830, 831 provided in silicon CMOS technology monolithically integrated with the PMIC 815 and/or RFIC 825 onto the (silicon) substrate 801. It will be appreciated that within the PMIC 815 and/or RFIC 825, the high voltage, high frequency capable vertical group III-nitride transistors described herein need not be utilized in exclusion to CMOS, but rather silicon CMOS may be further included in each of the PMIC 815 and RFIC 825.

The transistor connected diodes and group III-nitride transistors described herein may be specifically utilized where a high voltage swings present (e.g., 8-10V battery power regulation, DC-to-DC conversion, etc. within the PMIC 815). As illustrated, in the exemplary embodiment the PMIC 815 has an input coupled to the battery 813 and has an output provide a current supply to all the other functional modules in the SoC 810. In a further embodiment, where additional ICs are provided within the mobile computing platform 800 but off the SoC 810, the PMIC 815 output further provides a current supply to all these additional ICs off the SoC 810. Particular embodiments of the group III-nitride transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-80% of chip area, embodiments of the PMIC implemented in the group III-nitride transistors described herein offer a significant shrink over other PMIC architectures.

As further illustrated, in the exemplary embodiment the PMIC 815 has an output coupled to an antenna and may further have an input coupled to a communication module on the SoC 810, such as an RF analog and digital baseband module (not depicted). Alternatively, such communication modules may be provided on an IC off-chip from the SoC 810 and coupled into the SoC 810 for transmission. Depending on the group III-nitride materials utilized, the transistor connected diodes and group III-nitride transistors described herein (e.g., transistor connected diode 101 group III-N transistor 151) may further provide the large power added efficiency (PAE) needed from a power amplifier transistor having a frequency of at least ten times carrier frequency (e.g., a 1.9 GHz in an RFIC 825 designed for 3G or GSM cellular communication).

Figure 9:
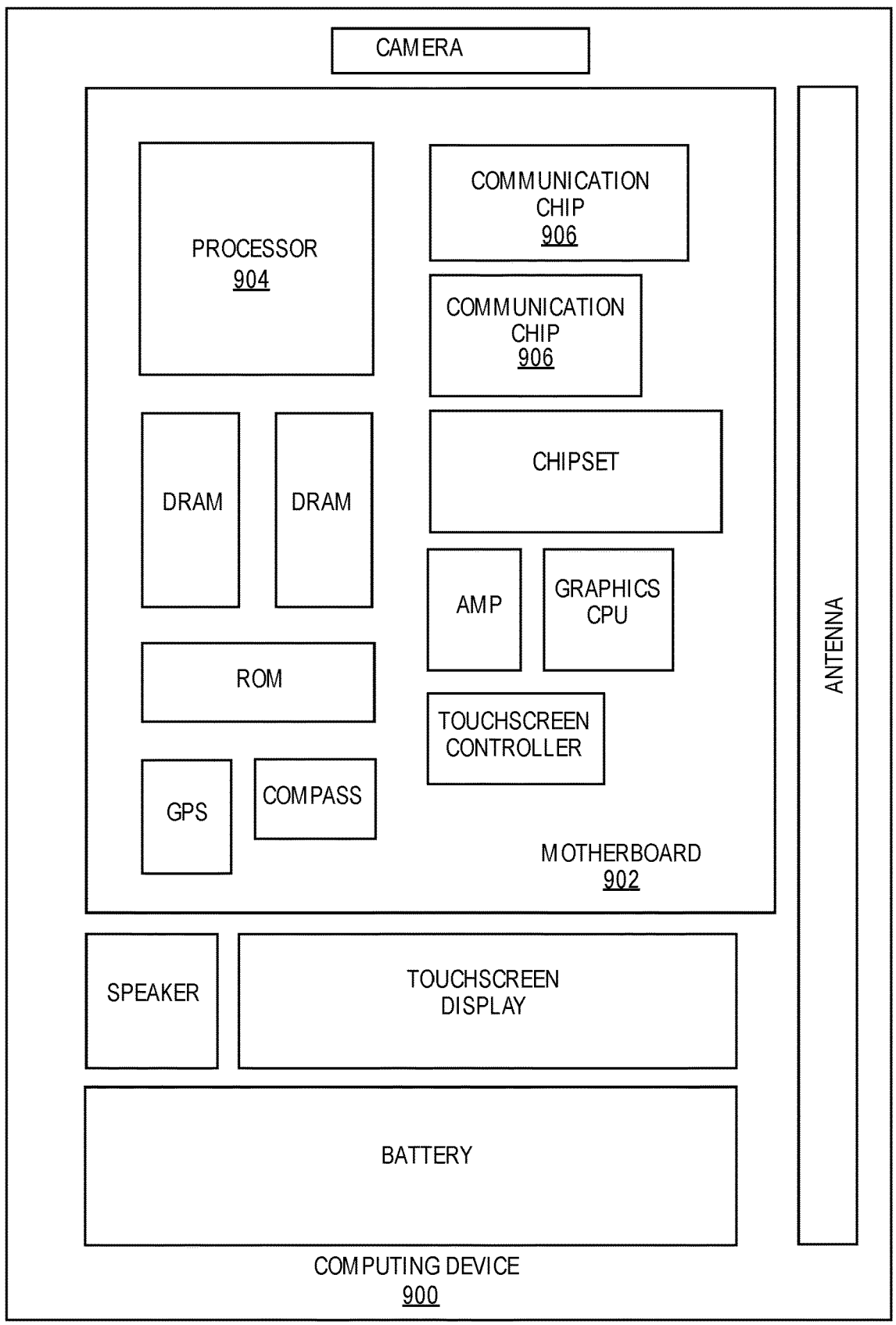
FIG. 9 illustrates a computing device in accordance with embodiments of the present invention.

FIG. 9 illustrates an example computing device 900 implemented with the integrated circuit structures in accordance with some embodiments of the present disclosure. As can be seen, the computing device 900 houses a motherboard 902. The motherboard 902 may include a number of components, including, but not limited to, a processor 904 that includes transistor connected diodes and group III-nitride transistors integrated with silicon CMOS transistors and at least one communication chip 906, each of which can be physically and electrically coupled to the motherboard 902, or otherwise integrated therein. As will be appreciated, the motherboard 902 may be, for example, any printed circuit board, whether a main board, a daughterboard mounted on a main board, or the only board of system 900, etc.

Depending on its applications, computing device 900 may include one or more other components that may or may not be physically and electrically coupled to the motherboard 902. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 900 may include one or more integrated transistor connected diodes and group III-nitride transistors formed using the disclosed techniques in accordance with an example embodiment or transistor connected diodes and group III-nitride transistors integrated with silicon CMOS transistor devices. In some embodiments, multiple functions can be integrated into one or more chips (e.g., for instance, note that the communication chip 906 can be part of or otherwise integrated into the processor 904).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including, but not limited to, Wi-Fi (IEEE 902.11 family), WiMAX (IEEE 902.16 family), IEEE 902.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others. In some embodiments, communication chip 906 may be implemented with the techniques and/or structures variously described herein, such that the communication chip 906 includes one or more transistor connected diodes and group III-nitride transistors including a dual drain/gate and single source heterostructure design, for example.

The processor 904 of the computing device 900 includes an integrated circuit die packaged within the processor 904. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 906 also may include an integrated circuit die packaged within the communication chip 906. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 904 (e.g., where functionality of any communication chips 906 is integrated into processor 904, rather than having separate communication chips). Further note that processor 904 may be a chip set having such wireless capability. In short, any number of processor 904 and/or communication chips 906 can be used. Likewise, any one chip or chip set can have multiple functions integrated therein.

In various implementations, the computing device 900 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 10:
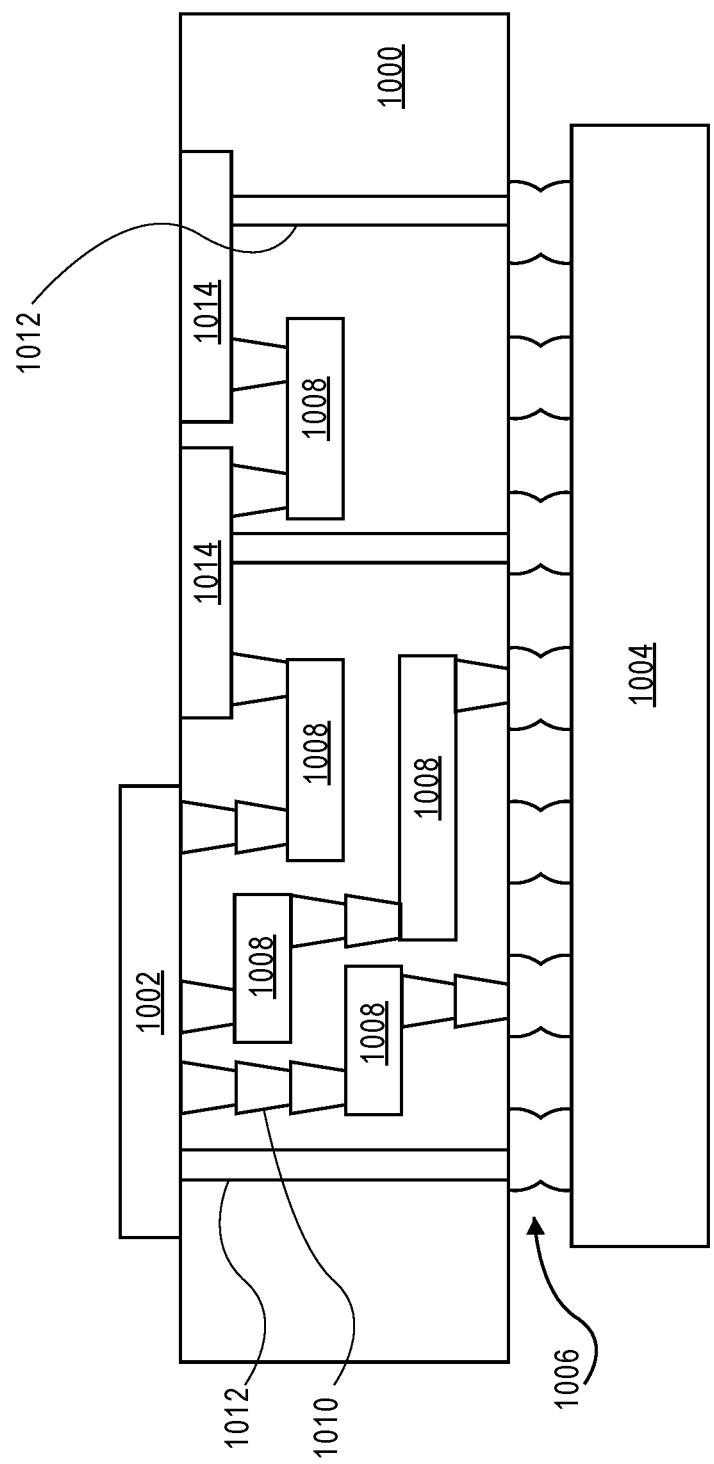
FIG. 10 illustrates an interposer in accordance with embodiments of the present invention.

FIG. 10 illustrates an interposer 1000 in accordance with embodiments of the present invention. The interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a logic module including an array of transistor connected diodes and an array of group III-nitride transistors, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further iinplementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000.

Thus, embodiments of the present invention include transistor connected diode devices and group III-N transistor devices and their methods of fabrication.

Example 1

A transistor connected diode structure, including a group III-nitride (III-N) semiconductor material is disposed on a substrate. A raised source structure and a raised drain structure are disposed on the group III-N semiconductor material. A mobility enhancement layer is disposed on the group III-N semiconductor material between the raised source structure and ihe raised drain structure. A polarization charge inducing layer is disposed on the mobility enhancement layer between the raised source structure and the raised drain structure where the polarization charge inducing layer has a first portion and a second portion separated by a gap. A gate dielectric layer is disposed on the mobility enhancement layer in the gap. A first metal electrode has a first portion that is disposed on the raised drain structure, a second portion that is disposed above the second portion of the polarization charge inducing layer and a third portion that is disposed on the gate dielectric layer in the gap. A second metal electrode is disposed on the raised source structure.

Example 2

The transistor connected diode structure of Example 1, wherein the group III-N semiconductor material includes a doped gallium nitride (GaN) and the polarization charge inducing layer includes a group III-N semiconductor material that includes aluminum

Example 3

The transistor connected diode structure of Example 1, wherein the mobility enhancement layer is AlN.

Example 4

The transistor connected diode structure of Example 1, wherein the raised source structure and the raised drain structure include n-type impurity dopants.

Example 5

The transistor connected diode structure of Example 1, wherein the dielectric layer is a Hi-K dielectric layer.

Example 6

The transistor connected diode structure of Example 1 or Example 2, wherein the polarization charge inducing layer has a thickness of at least 3 nm.

Example 7

The transistor connected diode structure of Example 1, Example 2 or Example 6, wherein the first metal electrode is disposed over a portion of the first portion of polarization charge inducing layer.

Example 8

The transistor connected diode structure of Example 1, Example 2 or Example 4, wherein the raised source structure and the raised drain structure include an InGaN material.

Example 9

The transistor connected diode structure of Example 1, Example 2 or Example 6 or Example 7, further include a 2 DEG layer present in the group III-N semiconductor material under the first and second portions of the polarization charge inducing layer, but not in the gap.

Example 10

A group III-Nitride (III-N) semiconductor structure, includes a transistor connected diode structure, wherein the transistor connected diode structure further includes a group III-nitride (III-N) semiconductor material disposed on a substrate. A first raised source structure and a first raised drain structure is disposed on the group III-N semiconductor material. A mobility enhancement layer is disposed on the group III-N semiconductor material, between the first raised source structure and the first raised drain structure. A polarization charge inducing layer is disposed on the mobility enhancement layer between the first raised source structure and the first raised drain structure, the polarization charge inducing layer has a first portion and a second portion separate by a gap. A gate dielectric layer is disposed on the mobility enhancement layer in the gap. A first metal electrode has a first portion that is disposed on the raised drain structure, a second portion that is disposed on the gate dielectric layer on the second portion of the polarization charge inducing layer and a third portion that is disposed on the gate dielectric layer in the gap. A second metal electrode is disposed on the raised source structure. A group III-N transistor structure is disposed on the substrate, the group III-N transistor structure including a second raised source structure and a second raised drain structure disposed on the group III-N semiconductor material. The mobility enhancement layer is disposed on the group III-N semiconductor material, between the second raised source structure and the second raised drain structure. The polarization charge inducing layer is disposed on the mobility enhancement layer between the second raised source structure and the second raised drain structure, wherein the polarization charge inducing layer has a third portion and a fourth portion that is separated by a second gap. The gate dielectric layer is disposed on the mobility enhancement layer in the second gap. A gate electrode is disposed on the dielectric layer above the second gap between the second raised drain structure and the second raised source structure. A source contact is disposed above the second raised source structure and a drain contact disposed above the second raised drain structure.

Example 11

The group III-Nitride (III-N) semiconductor structure of Example 10, further includes an isolation region in the substrate between the transistor connected diode structure and the group III-N transistor structure.

Example 12

The group III-Nitride (III-N) semiconductor structure of Example 10 or Example 11, wherein the isolation region is between one of the first raised drain structure or the first raised source structure of the transistor connected diode structure and one of the second raised source structure or the second raised drain structure of the group III-N transistor structure.

Example 13

The group III-Nitride (II-N) semiconductor structure of Example 10 or Example 11, Example 12, further includes a gate dielectric layer on the isolation region and on the one of the first raised drain structure and on the first raised source structure and on the one of the second raised drain structure and second raised source structure.

Example 14

The group III-Nitride (III-N) semiconductor structure of Example 10, Example 11 or Example 13, wherein first electrode of the transistor connected diode structure is coupled to the one of the second raised drain structure or the second raised source structure of the group III-N transistor structure.

Example 15

The group III-Nitride (III-N) semiconductor structure of Example 10, Example 11, wherein the group III-N semiconductor material includes a doped gallium nitride (GaN) and the polarization charge inducing layer includes a group III-N semiconductor material that includes aluminum.

Example 16

The group III-Nitride (III-N) transistor structure of Example 10, wherein the mobility enhancement layer is AlN.

Example 17

The group III-Nitride (III-N) transistor structure of Example 10, wherein the first and second raised source structures and the first and second raised drain structures include n-type impurity dopants.

Example 18

The transistor connected diode structure of Example 10, wherein the first metal electrode and the second metal electrode include one or more layers of a metal and a metal alloy.

Example 19

The group III-N transistor structure of Example 10, wherein the gate electrode includes a work function layer and a metal cap.

Example 20

A method of fabricating a transistor connected diode structure, the method includes providing a group III-N semiconductor material on a substrate. The method further includes forming a mobility enhancement layer on the group III-N semiconductor material. The method includes forming a polarization charge inducing layer on the mobility enhancement layer. The method includes forming an isolation region in the polarization charge inducing layer. The method includes forming a first raised source structure and a raised drain structure. The method includes forming a recess in the polarization charge inducing layer, the recess providing a gap separating a first portion of the polarization charge inducing layer from a second portion of the polarization charge inducing layer. The method includes forming a gate dielectric layer on the mobility enhancement layer in the gap, removing the gate dielectric layer exposing a portion of an uppermost surface of the first raised drain structure. The method includes forming a first opening in a dielectric layer, the opening exposing the gate dielectric layer over the gap and the portion of the uppermost surface of the first raised drain structure. The method includes forming an electrode in the first opening, forming a second opening, the second opening exposing the raised source structure and forming a source contact in the second opening.

Example 21

A method of fabricating group III-Nitride (III-N) semiconductor structure, the method includes providing a group III-N semiconductor material on a substrate. The method includes forming a mobility enhancement layer on the group III-N semiconductor material. The method includes forming a polarization charge inducing layer on the mobility enhancement layer. The method further includes forming an isolation region in the polarization charge inducing layer, in the mobility enhancement layer and in the group III-N semiconductor material to separate a transistor connected diode region from a group III-N transistor region. The method includes forming a first raised source structure and a first raised drain structure in the transistor connected diode region and a second raised source structure and a second raised drain structure in the group III-N transistor region. The method further includes forming a first recess and a second recess in the polarization charge inducing layer, wherein the first recess in the transistor connected diode region provides a first gap separating a first portion of the polarization charge inducing layer from a second portion of the polarization charge inducing layer, and the second recess in the group III-N transistor region provides a second gap separating a third portion of the polarization charge inducing layer from a fourth portion of the polarization charge inducing layer. The method further includes forming a gate dielectric layer on the mobility enhancement layer in the first gap and in the second gap. The method includes removing the gate dielectric layer in the transistor connected diode region exposing a portion of an uppermost surface of the first raised drain structure, forming a first opening and a second opening in a dielectric layer, wherein the first opening in the transistor connected diode region exposes the gate dielectric layer over the first gap and the exposed portion of uppermost surface of the first raised drain structure, and the second opening in the group III-N transistor region exposes the gate dielectric layer over the second gap. The method further includes forming a first electrode in the first opening in the transistor connected diode region and a gate electrode in the second opening in the group III-N transistor region. The method includes forming a third opening, a fourth opening and a fifth opening in the dielectric layer, wherein the third opening exposing the first raised source structure in the transistor connected diode region, the fourth opening exposing the second raised source structure in the group III-N transistor region and the fifth opening exposing the second raised drain structure in the group III-N transistor region. The method further includes forming a first source contact in the third opening of the transistor connected diode region, a second source contact in the fourth opening of the group III-N transistor region and a drain contact in the fifth opening of the group III-N transistor region.

Example 22

The method of fabricating group III-Nitride (III-N) semiconductor structure of Example 21, includes forming the gate dielectric layer over the isolation region separating the transistor connected diode region from the group III-N transistor region.

Example 23

The method of fabricating group III-Nitride (III-N) semiconductor structure of Example 21 or Example 22, includes forming the gate dielectric layer between one of the first raised drain structure or the first raised source structure of the transistor connected diode region and one of the second raised source structure or the second raised drain structure of the group III-N transistor region.

Example 24

The method of fabricating group III-Nitride (III-N) semiconductor structure of Example 21, Example 22 or Example 23, wherein removing the gate dielectric layer in the transistor connected diode region exposes a portion of the polarization charge inducing layer and an uppermost surface of the first raised drain structure.

What is claimed is:
1. A transistor connected diode structure, comprising:
   a group III-nitride (III-N) semiconductor material disposed on a substrate;
   a raised source structure and a raised drain structure disposed on the group III-N semiconductor material;

a mobility enhancement layer disposed on the group III-N semiconductor material, between the raised source structure and the raised drain structure;
a polarization charge inducing layer disposed on the mobility enhancement layer between the raised source structure and the raised drain structure, the polarization charge inducing layer having a first portion and a second portion separated by a gap;
a gate dielectric layer disposed on the mobility enhancement layer in the gap;
a first metal electrode having a first portion disposed on the raised drain structure, a second portion disposed above the second portion of the polarization charge inducing layer and a third portion disposed on the gate dielectric layer in the gap; and
a second metal electrode disposed on the raised source structure.

2. The transistor connected diode structure of claim 1, wherein the group III-N semiconductor material includes a gallium nitride (GaN) and the polarization charge inducing layer includes a group III-N semiconductor material that includes aluminum.

3. The transistor connected diode structure of claim 1, wherein the mobility enhancement layer is AlN.

4. The transistor connected diode structure of claim 1, wherein the raised source structure and the raised drain structure include n-type impurity dopants.

5. The transistor connected diode structure of claim 1, wherein the dielectric layer is a Hi-K dielectric layer.

6. The transistor connected diode structure of claim 1, wherein the polarization charge inducing layer has a thickness of at least 3 nm.

7. The transistor connected diode structure of claim 1, wherein the first metal electrode is disposed over a portion of the first portion of polarization charge inducing layer.

8. The transistor connected diode structure of claim 1, wherein the raised source structure and the raised drain structure include an InGaN material.

9. The transistor connected diode structure of claim 1, further comprising 2 DEG layer present in the group III-N semiconductor material under the first and second portions of the polarization charge inducing layer, but not in the gap.

10. A group III-Nitride (III-N) semiconductor structure, comprising:
a transistor connected diode structure, comprising:
a group III-nitride (III-N) semiconductor material disposed on a substrate;
a first raised source structure and a first raised drain structure disposed on the group III-N semiconductor material;
a mobility enhancement layer disposed on the group III-N semiconductor material, between the first raised source structure and the first raised drain structure;
a polarization charge inducing layer disposed on the mobility enhancement layer between the first raised source structure and the first raised drain structure, the polarization charge inducing layer having a first portion and a second portion separate by a gap;
a gate dielectric layer disposed on the mobility enhancement layer in the gap;
a first metal electrode having a first portion disposed on the raised drain structure,
a second portion disposed on the gate dielectric layer on the second portion of the polarization charge inducing layer and a third portion disposed on the gate dielectric layer in the gap;
a second metal electrode disposed on the raised source structure;
a group III-N transistor structure disposed on the substrate, the group III-N transistor structure comprising:
a second raised source structure and a second raised drain structure disposed on the group III-N semiconductor material;
the mobility enhancement layer disposed on the group III-N semiconductor material, between the second raised source structure and the second raised drain structure;
the polarization charge inducing layer disposed on the mobility enhancement layer between the second raised source structure and the second raised drain structure, the polarization charge inducing layer having a third portion and a fourth portion separated by a second gap;
the gate dielectric layer disposed on the mobility enhancement layer in the second gap;
a gate electrode disposed on the dielectric layer above the second gap between the second raised drain structure and the second raised source structure; and
a source contact disposed above the second raised source structure and a drain contact disposed above the second raised drain structure.

11. The group III-Nitride (III-N) semiconductor structure of claim 10, further comprising an isolation region in the substrate between the transistor connected diode structure and the group III-N transistor structure.

12. The group III-Nitride (III-N) semiconductor structure of claim 11, wherein the isolation region is between one of the first raised drain structure or the first raised source structure of the transistor connected diode structure and one of the second raised source structure or the second raised drain structure of the group III-N transistor structure.

13. The group III-Nitride (III-N) semiconductor structure of claim 11, further comprising a gate dielectric layer on the isolation region and on the one of the first raised drain structure and on the first raised source structure and the one of the second raised drain structure and second raised source structure.

14. The group III-Nitride (III-N) semiconductor structure of claim 10, wherein first electrode of the transistor connected diode structure is coupled to the one of the second raised drain structure or the second raised source structure of the group III-N transistor structure.

15. The group III-Nitride (III-N) semiconductor structure of claim 10, wherein the group III-N semiconductor material includes a doped gallium nitride (GaN) and the polarization charge inducing layer includes a group III-N semiconductor material that includes aluminum.

16. The group III-Nitride (III-N) semiconductor structure of claim 10, wherein the mobility enhancement layer is AlN.

17. The group III-Nitride (III-N) semiconductor structure of claim 10, wherein the first and second raised source structures and the first and second raised drain structures include n-type impurity dopants.

18. The group III-Nitride (III-N) semiconductor structure of claim 10, wherein the first metal electrode and the second metal electrode comprise one or more layers of a metal and a metal alloy.

19. The group III-Nitride (III-N) semiconductor structure of claim 10, wherein the gate electrode comprises a work function layer and a metal cap.

20. A method of fabricating a transistor connected diode structure, the method comprising:

providing a group III-N semiconductor material on a substrate;

forming a mobility enhancement layer on the group III-N semiconductor material;

forming a polarization charge inducing layer on the mobility enhancement layer;

forming an isolation region in the polarization charge inducing layer;

forming a first raised source structure and a raised drain structure;

forming a recess in the polarization charge inducing layer, the recess providing a gap separating a first portion of the polarization charge inducing layer from a second portion of the polarization charge inducing layer;

forming a gate dielectric layer on the mobility enhancement layer in the gap;

removing the gate dielectric layer exposing a portion of an uppermost surface of the first raised drain structure;

forming a first opening in a dielectric layer, the opening exposing the gate dielectric layer over the gap and the portion of the uppermost surface of the first raised drain structure;

forming an electrode in the first opening;

forming a second opening, the second opening exposing the raised source structure; and forming a source contact in the second opening.

21. A method of fabricating group III-Nitride (III-N) semiconductor structure, the method comprising:

providing a group III-N semiconductor material on a substrate;

forming a mobility enhancement layer on the group III-N semiconductor material;

forming a polarization charge inducing layer on the mobility enhancement layer;

forming an isolation region in the polarization charge inducing layer, in the mobility enhancement layer and in the group III-N semiconductor material to separate a transistor connected diode region from a group III-N transistor region;

forming a first raised source structure and a first raised drain structure in the transistor connected diode region and a second raised source structure and a second raised drain structure in the group III-N transistor region;

forming a first recess and a second recess in the polarization charge inducing layer, the first recess in the transistor connected diode region providing a first gap separating a first portion of the polarization charge inducing layer from a second portion of the polarization charge inducing layer, the second recess in the group III-N transistor region providing a second gap separating a third portion of the polarization charge inducing layer from a fourth portion of the polarization charge inducing layer;

forming a gate dielectric layer on the mobility enhancement layer in the first gap and in the second gap;

removing the gate dielectric layer in the transistor connected diode region exposing a portion of an uppermost surface of the first raised drain structure;

forming a first opening and a second opening in a dielectric layer, the first opening in the transistor connected diode region exposing the gate dielectric layer over the first gap and the exposed portion of uppermost surface of the first raised drain structure, the second opening in the group III-N transistor region exposing the gate dielectric layer over the second gap;

forming a first electrode in the first opening in the transistor connected diode region and a gate electrode in the second opening in the group III-N transistor region;

forming a third opening, a fourth opening and a fifth opening in the dielectric layer, the third opening exposing the first raised source structure in the transistor connected diode region, the fourth opening exposing the second raised source structure in the group III-N transistor region and the fifth opening exposing the second raised drain structure in the group III-N transistor region;

forming a first source contact in the third opening of the transistor connected diode region, a second source contact in the fourth opening of the group III-N transistor region and a drain contact in the fifth opening of the group III-N transistor region.

22. The method of claim 21, wherein forming the gate dielectric layer includes forming the gate dielectric layer over the isolation region separating the transistor connected diode region from the group III-N transistor region.

23. The method of claim 21, wherein forming the gate dielectric layer includes forming the gate dielectric layer between one of the first raised drain structure or the first raised source structure of the transistor connected diode region and one of the second raised source structure or the second raised drain structure of the group III-N transistor region.

24. The method of claim 21, wherein removing the gate dielectric layer in the transistor connected diode region exposes a portion of the polarization charge inducing layer and an uppermost surface of the first raised drain structure.

* * * * *